US009727676B1

(12) United States Patent
Saurabh et al.

(10) Patent No.: US 9,727,676 B1
(45) Date of Patent: Aug. 8, 2017

(54) METHOD AND APPARATUS FOR EFFICIENT GENERATION OF COMPACT WAVEFORM-BASED TIMING MODELS

(71) Applicant: CADENCE DESIGN SYSTEMS, INC., San Jose, CA (US)

(72) Inventors: Sneh Saurabh, Uttar Pradesh (IN); Naresh Kumar, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/072,162

(22) Filed: Mar. 16, 2016

(51) Int. Cl.
G06F 9/455 (2006.01)
G06F 17/50 (2006.01)

(52) U.S. Cl.
CPC .................. *G06F 17/5031* (2013.01)

(58) Field of Classification Search
USPC .......................... 716/106, 107, 108, 109, 134
See application file for complete search history.

(56) References Cited

U.S. PATENT DOCUMENTS

| 4,322,636 A * | 3/1982 | Schroder ................ H03K 4/00 327/104 |
| 6,996,515 B1 * | 2/2006 | Foltin ................. G06F 17/5031 703/19 |
| 7,984,404 B2 | 7/2011 | Do et al. |
| 2003/0115526 A1 * | 6/2003 | Fetherson ........ G01R 31/31832 714/738 |

OTHER PUBLICATIONS

D. S. Venkatesh, R. Palermo, M. Mortazavi, K.A. Sakallah, "Timing Abstraction of Intellectual Property Blocks", Proc. of the IEEE Custom Integrated Circuits Conf., pp. 99-102, May 1997.
N. Kobayashi and S. Malik, "Delay Abstraction in Combinational Logic Circuits", IEEE Trans. on Computer-Aided Design of Integrated Circuits and Systems, vol. 16, No. 10, pp. 1205-1212, Oct. 1997.
A. J. Daga, L. Mize, S. Sripada, C. Wolff and Q. Wu "Automated Timing Model Generation", Proc. of Design Automation Conference, pp. 146-151, 2002.

(Continued)

*Primary Examiner* — Brian Ngo
(74) *Attorney, Agent, or Firm* — Rosenberg, Klein & Lee

(57) ABSTRACT

For a circuit path to be represented in a timing model, a set of propagating waveforms substantially converges through waveform stabilization to a uniform waveform at a waveform invariant node and all pins following. The circuit path is decomposed at the waveform invariant node into first and second portions, which are characterized as first and second timing arcs. In computing output slew and delay values, the first timing arc generation factors only a single output load of the waveform invariant node, and the second timing arc generation factors only the uniform waveform. Similarly, a setup arc employs the uniform waveform rather than multiple clock input waveforms in computing setup/hold values. Simulation of waveform propagation is also simplified by simulating only the uniform waveform for the second portion. Additionally, the first arc may be shared between a plurality of circuit paths which share an input pin and the waveform invariant node.

20 Claims, 14 Drawing Sheets

(56) References Cited

OTHER PUBLICATIONS

C. W. Moon, H. Kriplani, and K. Belkhale, "Timing Model Extraction of Hierarchical Blocks by Graph Reduction", Proc. of Design Automation Conference, pp. 152-157, 2002.

R. Chen and H. Zhou, "Timing Macro-modeling of IP Blocks with Crosstalk", International Conference on Computer Aided Design (ICCAD), pp. 155-159, Nov. 2004.

S. Zhou, Y. Zhu, Y. Hu, R. Graham, M. Hutton and C.-K. Cheng, "Timing Model Reduction for Hierarchical Timing Analysis", International Conference on Computer Aided Design (ICCAD), pp. 415-422, Nov. 2006.

R. Goyal, N. Kumar, and H. Parameswaran, "Variation Aware Extracted Timing Model", Midwest Symposium on Circuits and Systems, pp. 5-8, Aug. 2007.

B. Li N. Chen, Y. Xu, U. Schlichtmann, "On Timing Model Extraction and Hierarchical Statistical Timing Analysis," IEEE Transactions on Computer-Aided Design of Integrated Circuits and Systems, vol. 32, No. 3, pp. 367-380, Mar. 2011.

J. F. Croix and D. F. Wong, "Blade and Razor: Cell and Interconnect Delay Analysis Using Current-Based Models", Design Automation Conference, pp. 386-389, Jun. 2003.

V. Veetil, D. Sylvester and D. Blaauw, "Fast and Accurate Waveform Analysis with Current Source Models", 9th International Symposium on Quality Electronic Design, pp. 53-56, Mar. 2008.

I. Keller, K. H. Tam, V. Kariat, "Challenges in Gate Level Modeling for Delay and Si at 65nm and Below", Design Automation Conference, pp. 468-473, Jun. 2008.

M. Jiang, Z. Huang, A. Kurokawa, Y. Inoue, "An Advanced Model for Calculating the Effective Capacitance considering Input Waveform Effect", International Conference on Communications, Circuits and Systems, pp. 1088-1092, May 2008.

R. Molina, "How to Close Timing with Hundreds of Multi-Mode/Multi-Corner Views", Electronic Engineering Journal, Dec. 6, 2012, http://www.eejournal.com/archives/articles/20121206-cadence.

M. Coppejans, "On Kolmogorov's Representation of Functions of Several Variables by Functions of One Variable," Department of Economics, Duke University, Jan. 2003.

K. Yamamura, "An algorithm for representing functions of many variables by superpositions of functions of one variable and addition", IEEE Transactions on Circuits and Systems I: Fundamental Theory and Applications, vol. 43, No. 4, pp. 338-340, Apr. 1996.

E Miliczka, "Constructive decomposition of a function of two variables as a sum of functions of one variable," Proc. of American Mathematical Society, vol. 137, No. 2, pp. 607-614, Feb. 2009.

http://www.cadence.com/Alliances/languages/Pages/ecsm.aspx.

\* cited by examiner

METHOD AND APPARATUS FOR EFFICIENT GENERATION OF COMPACT WAVEFORM-BASED TIMING MODELS

BACKGROUND OF THE INVENTION

The subject system and method are generally directed to the efficient generation of highly compact timing models for use in timing analysis of circuit designs. More specifically, the system and method include identification of a waveform invariant node for a given circuit path and optimized generation and configuration of a timing model based thereon.

With the increase in the size and complexity of circuit designs, divide-and-conquer methodologies executed using hierarchical design implementation and sign-off have become the preferred design approach. One of the extensively employed methodologies for hierarchical design implementation is based on the Extracted Timing Model (ETM). An ETM encapsulates the timing information of circuit paths of a given block, often although not necessarily in Synopsys Liberty Format (.lib format). The ETMs of different blocks of a design are extracted and plugged-in at the top-level for performing top-level timing analysis, with the extracted data abstracting or black-boxing certain details to reduce model space and analysis runtime. The ETM-based methodology is widely used both for design implementation and timing sign-off.

One quality of a circuit modeled in an ETM is the non-ideal transition (such as ramp-up or ramp-down of voltage) of signals as they traverse various components. Traditionally, this change has been assumed to be a linear rise or fall over a determined time period, and characterized accordingly by discrete input slew or output slew parameters. However, when modeling advanced technology nodes, this assumption has proven too inexact, and therefore actual sample points which more closely characterize input and output waveforms are computed to replace these parameters.

Each characterized waveform requires considerably more information than an equivalent slew, and therefore considerably more data storage space. If all slews in an ETM are replaced with waveform samples, the size of the ETM can increase dramatically (with a twenty-fold increase or more not uncommon). Additionally, determining each output slew involves simulating propagation of the corresponding input slew step-by-step through the circuit path, which is particularly runtime intensive when the slews are replaced with waveforms.

There is therefore a need for more efficient methodologies of representing a circuit path in a waveform-based ETM, and of generating said ETMs.

SUMMARY OF THE INVENTION

It is an object of the disclosed system and method to reduce runtime and memory required to compute waveforms in the generation of a timing model.

It is another object of the disclosed system and method to reduce a size of a timing model, without reducing accuracy of the model.

It is yet another object of the disclosed system and method to reduce a required number of waveforms and other data values in a representation of a circuit path, without reducing accuracy of the representation.

It is still another object of the disclosed system and method to remove redundancy in representations of pluralities of circuit paths.

These and other objects may be attained in a system and method for efficient generation of compact waveform-based timing models. While not limited thereto, a disclosed embodiment is directed to a method of compressing a timing model representing at least one circuit path. The circuit path traverses at least one circuit stage coupled to a plurality of pins.

In certain embodiments, the method includes predefining a plurality of alternate input parameter values for an input parameter and a plurality of alternate output parameter values for an output parameter for the circuit path, and executing a processor to generate a timing model for instantiating each combination of predefined alternate input and output parameter values. Each of the predefined alternate input parameter values has associated therewith an input signal waveform representing voltage change over time. The timing model defines a timing arc between each selected combination of predefined alternate input and output parameter values. The timing arc is decomposed into at least first and second timing arc components.

In certain embodiments, the generation of the timing model includes selectively identifying one of the pins as a waveform invariant node for propagation of the input signal waveforms through the circuit path. The input signal waveforms, as propagated, reduce in mutual waveform variation with respect to one another during propagation from an input pin of the circuit path to the waveform invariant node, and substantially converge thereby to a uniform waveform beyond the waveform invariant node.

In certain embodiments, the generation of the timing model includes generating the first timing arc component to parametrically define timing attributes of a first path portion extending from the input pin to the waveform invariant node, and generating the second timing arc component to parametrically define timing attributes of a second path portion extending from the waveform invariant node to an output pin of the circuit path.

In certain embodiments, the first timing arc component defines, for each of the predefined alternate input parameter values, a first arc output waveform based on the corresponding predefined alternate input parameter value and subject to a common value of the predetermined output parameter at the waveform invariant node. The second timing arc component defines, for each of the predefined alternate output parameter values, a second arc output waveform based commonly on the uniform waveform and subject to the corresponding predefined alternate output parameter value. The first arc output waveforms thereby corresponds in number to the predefined alternate input slew parameters, and the second arc output waveforms thereby corresponds in number to the predefined alternate output load parameters.

While not limited thereto, another disclosed embodiment is directed to a method of streamlined generation of a waveform-based timing model representing at least one circuit path. The circuit path traverses at least one circuit stage coupled to a plurality of pins.

In certain embodiments, the method includes predefining a plurality of alternate input parameter values for an input parameter and a plurality of alternate output parameter values for an output parameter for the circuit path, and executing a processor to generate a timing model for instantiating each combination of predefined alternate input and output parameter values. Each of the predefined alternate input parameter values has an input signal waveform associated therewith, representing voltage change over time. The timing model defines a timing arc between each selected combination of predefined alternate input and output parameter values.

In certain embodiments, the generation of the timing model includes simulating propagation of each of the input signal waveforms through consecutive ones of the pins in a first path portion of the circuit path, and thereafter substituting further propagation of the input signal waveforms with simulated propagation of one uniform waveform through consecutive ones of the pins in a second path portion of the circuit path.

In certain embodiments, the generation of the timing model includes computing a waveform variation parameter for at least one of the pins in the first path portion. The waveform variation parameter indicates a degree of mutual difference between input signal waveforms as propagated through the pin.

In certain embodiments, the generation of the timing model includes selectively identifying one of the pins as a waveform invariant node responsive to the waveform variation parameter at the pin.

In certain embodiments, the first path portion is defined between a first of the pins of the circuit path and the waveform invariant node, and the second path portion is defined between the waveform invariant node and a last of the pins of the circuit path.

While not limited thereto, another disclosed embodiment is directed to a system for streamlined generation of a waveform-based timing model representing at least one circuit path. The circuit path traverses at least one circuit stage coupled to a plurality of pins.

In certain embodiments, the system includes a timing model generator configured to generate a timing model for instantiating each combination of pluralities of predefined alternate values for input and output parameters. Each of the predefined alternate input parameter values has an input signal waveform associated therewith, representing voltage change over time. The timing model defines a timing arc between each selected combination of predefined alternate input and output parameter values.

In certain embodiments, the timing model generator includes a waveform simulator configured to simulate propagation of a waveform through a plurality of pins.

In certain embodiments, the timing model generator includes a waveform variation parameter calculator configured to compute a waveform variation parameter indicating a degree of mutual difference between waveforms.

In certain embodiments, the timing model generator includes a waveform invariant node selector configured to selectively identify a pin as a waveform invariant node responsive to the waveform variation parameter at the pin.

In certain embodiments, the generation of the timing model includes, in the waveform simulator, simulating propagation of each of the input signal waveforms through consecutive ones of the pins in a first path portion of the circuit path, and thereafter substituting further propagation of the input signal waveforms with simulated propagation of one uniform waveform through consecutive ones of the pins in a second path portion of the circuit path.

In certain embodiments, the generation of the timing model includes, in the waveform variation parameter calculator, for at least one of the pins in the first path portion, computing the waveform variation parameter between input signal waveforms as propagated through the pin.

In certain embodiments, the generation of the timing model includes, in the waveform invariant node selector, selectively identifying one of the pins as a waveform invariant node responsive to the waveform variation parameter at the pin.

In certain embodiments, the first path portion is defined between a first of the pins of the circuit path and the waveform invariant node, and the second path portion is defined between the waveform invariant node and a last of the pins of the circuit path.

Additional aspects, details, and advantages of the disclosed system and method will be set forth, in part, in the description and figures which follow.

DETAILED DESCRIPTION OF THE PREFERRED EMBODIMENTS

Figure 1:
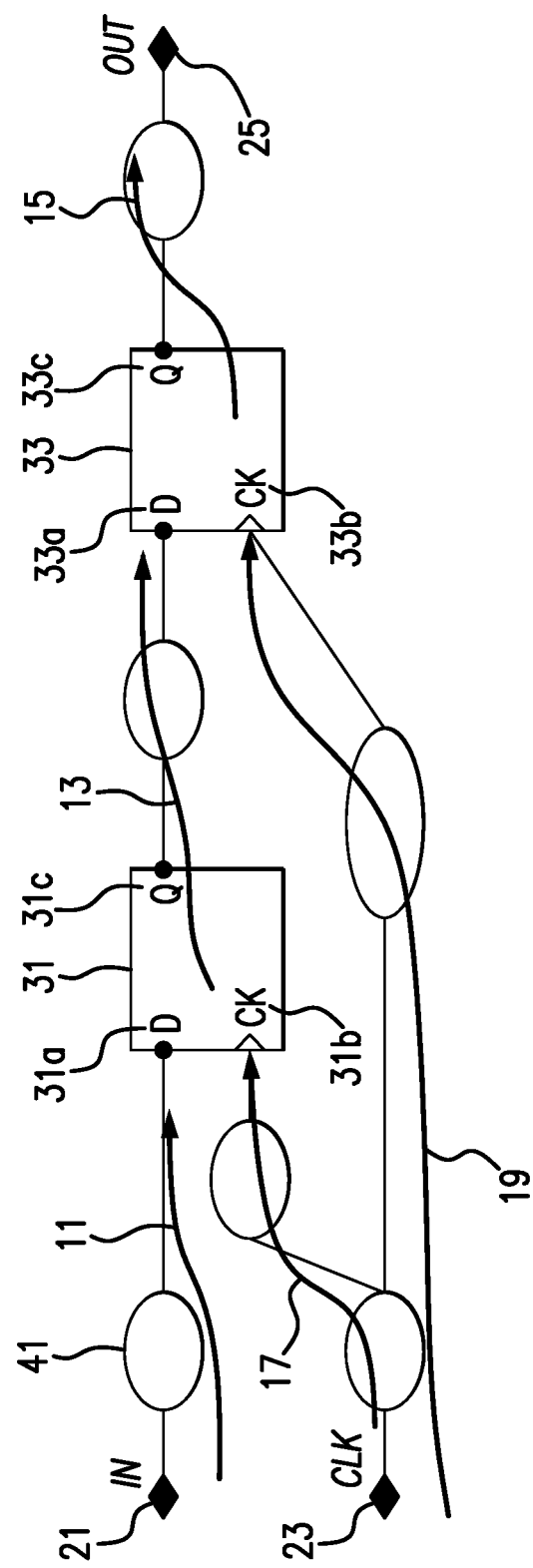
FIG. 1 is a circuit diagram illustrating an example circuit block and the paths within it.

Reference will now be made in detail to exemplary embodiments, which are illustrated in the accompanying drawings, wherein like reference numerals refer to the like elements throughout. The embodiments are described below in order to explain the disclosed system and method by referring to the figures.

Section headings are included in this Detailed Description. It is noted that these section headings are for convenience only and should not be interpreted as limiting the scope of the claimed invention in any way.

1. Extracted Timing Models Generally

Static timing analysis (STA) is a methodology, well-known in the art, to assess the timing of any given digital circuit using software techniques and certain models that provide relevant characteristics of the digital circuit. At the highest level of analysis, STA considers the timing of a signal over all possible paths through the circuit to confirm that said timing meets the requirements of the design, and in some cases determine whether synchronization measures such as holds are needed. STA is conducted by breaking down the design into circuit paths, calculating a delay of each path, and comparing the delays to the speed requirements.

At least some of the systems and techniques disclosed herein are applicable to other forms of circuit analysis, such as gate level simulation or dynamic timing analysis, with appropriate alteration. For convenience and brevity of illustration, however, these disclosures will generally assume a static timing analysis.

Certain concepts and terms relevant to the present invention will now be described.

A digital circuit design may be divided into circuit blocks which may be represented individually by models, each model substituted for the actual block in the circuit design for analysis purposes. The circuit block may include capturing and launching flip-flops which are used, respectively, to capture a data signal entering the block and launch a data signal exiting the block, for testing purposes.

FIG. 1 is a diagram illustrating paths through a simple example circuit block. The example circuit block includes an input port 21 receiving input from outside the circuit block which is fed to a data pin (D-pin) 31a of a capturing flip-flop 31. An output pin (Q-pin) 31c of the capturing flip-flop 31 passes output to a data pin 33a of a launching flip-flop 33. An output pin 33c of the launching flip-flop 33 passes output to an output port 25 of the circuit block, and from there out of the circuit block. Additionally, a clock source 23 provides a clock signal to a clock pin (CK-pin) 31b of the capturing flip-flop 31 and a clock pin 33b of the launching flip-flop 33. Note that in practice a circuit block may have any suitable number of input, output, and clock ports, and any suitable number of capturing and launching flip-flops, depending on the requirements of a particular intended application.

Other suitable logic may be also implemented in the regions of the example circuit block represented by ellipses, such as logic 41. Both individual logic elements and flip-flops are called "cells," and a cell in combination with its output interconnect structure is a "stage."

In the illustrated example circuit block, data paths include an input data path 11 from the input port 21 to the data pin 31a of the capturing flip-flop 31, an output data path 15 from the clock pin 33b of the launching flip-flop 33, and an internal data path 13 from the clock pin 31b of the capturing flip-flop 31 to the data pin 33a of the launching flip-flop 33.

Interface paths of a given circuit block encompass paths that pass through some input port or output port of the given block. These paths may be captured or launched by some other block or the top level of the entire circuit. Interface paths may be of several types: input port to flip-flop (such as data path 11), flip-flop to output port (such as data path 15), or input port to output port. It is noted that paths from a flip-flop to another flip-flop within the given block do not represent interface paths, as they do not enter or exit the circuit block. Therefore, in the example circuit block of FIG. 1, data path 13 is not an interface path.

Clock paths encompass paths starting from the pins that act as clock sources. For instance, in the example circuit block of FIG. 1, clock paths 17 and 19 begin at clock source 23, with clock path 17 ending at clock pin 31b of capturing flip-flop 31 and clock path 19 ending at clock pin 33b of launching flip-flop 33. A clock path that extends from a clock source to the clock-pin of the flip-flop where a data path starts serves as the launch clock path for that data path, while a clock path that extends from a clock source to the clock-pin of the flip-flop where the data path ends serves as the capture clock path for that data path. It is noted that a clock path may serve both tasks: in the example circuit block of FIG. 1, clock path 17 serves as the capture clock path for data path 11 and the launch clock path for data path 13, while clock path 19 serves as the capture clock path for data path 13 and the launch clock path for data path 15. When modeling the circuit block for analysis, the clock sources are defined by the user as linked to some pins of the design, along with other clock attributes like clock period and duty cycle. Representations of the clock sources, with attributes such as frequency, may be either generated or defined in the model or constraint-definition file; all such representations are referred to as "generated clocks."

A circuit path may be represented by a sequence of pins. The circuit path defined by n pins can be represented as $P_{1\leftarrow n}=\{p1, p2, \ldots, pk, \ldots, pm, \ldots, pn\}$. The pin p1 represents the first pin of the path, also termed an input or source pin (these terms will be used interchangeably hereinafter), and the pin pn represents the last pin of the path, also termed an output or sink pin (these terms will be used interchangeably hereinafter). For instance, in the example circuit block of FIG. 1, input pin 21 represents the source pin of any circuit path along interface path 11 (through logic 41), and data pin 31a represents the sink pin of any such circuit path. Logic 41 itself may have any suitable number of additional pins between the source and sink.

It is noted that two circuit paths $P_{1\leftarrow k}$ and $P_{k\leftarrow n}$ may be combined into a larger circuit path $P_{1\leftarrow n}$, when the same intermediate pin pk represents the sink pin of the first path and the source pin of the second. Conversely, a single circuit path may be decomposed into two or more serially-oriented paths or path portions at an intermediate pin pk.

A circuit path may also be defined by a sequence of stages. The first stage in a circuit path is the input pin of the circuit path and the following output structure, concluding at an output pin of the first stage, which is also an input pin of a following, second stage. However, each stage following the first may include more pins than just an input pin and output pin. For instance, in the example circuit block of FIG. 1, the output pin 33c of flip-flop 33 is not the output pin of any stage which contains flip-flop 33, but an intermediate pin, as the output structure beyond output pin 33c is also part of the stage. Instead, the stage does not end until the output structure contacts the input pin of another cell or the output pin 25 of the entire circuit path.

A timing arc is a data structure representation of a circuit path and characteristics thereof. In other words, the timing arc parametrically defines the timing attributes of the circuit path. A timing arc of a circuit path between two pins pi and pj is denoted as $Arc_{pi\leftarrow pj}$, and includes the following attributes representing characteristics of the circuit path:

1. source=pi: represents the source or input pin of the arc.
2. sink=pj: represents the sink or output pin of the arc.
3. $trans_{pi}$: represents the transition at the source pin pi. It can either rise or fall.
4. $trans_{pj}$: represents the transition at the sink pin pj. It can either rise or fall.

5. INSLEW($Arc_{pi \leftarrow pj}$): represents the set of slews at the source pin pi, which are more specifically termed input slew values or input slews. The input slew itself is a parameter which may take on any of the values in the set or other values. The kth slew in the timing arc is represented as INSLEW($Arc_{pi \leftarrow pj}$)[k]. The input slew values in the set are predefined, and preferably chosen to span the slew range in which the circuit block is anticipated to be instantiated, such that a plurality of alternate input slew parameters may be selected from for instantiation.

6. LOAD($Arc_{pi \leftarrow pj}$): represents the set of loads at the sink pin pj, which are more specifically termed output load values or output loads. The kth load in the arc is represented as LOAD($Arc_{pi \leftarrow pj}$)[k]. The output load itself is a parameter which may take on any of the values in the set or other values. The output load values in the set are predefined, and preferably chosen to span the load range in which the circuit block is anticipated to be instantiated, such that a plurality of alternate output load parameters may be selected from for instantiation.

7. OUTSLEW($Arc_{pi \leftarrow pj}$): represents the set of slews at the output pin pj, which are more specifically termed output slew values or output slews. The output slew itself is a parameter which may take on any of the values in the set or other values. An output slew is a function of the input slew applied at pi and the output load applied at pin pj; that is, the output slew is based on the input slew subject to the output load. Because an output slew is preferably provided in the set for each combination of input slew and output load in their respective sets, if the number of elements in INSLEW ($Arc_{pi \leftarrow pj}$) is N and the number of elements in LOAD ($Arc_{pi \leftarrow pj}$) is M, then normally the number of elements in OUTSLEW($Arc_{pi \leftarrow pj}$) is N×M. It is preferable to store these elements in a two-dimensional table, so that the relevant OUTSLEW element can be found by its corresponding INSLEW and LOAD elements. The output slew corresponding to the kth input slew and the lth load is therefore represented as OUTSLEW($Arc_{pi \leftarrow pj}$)[k][l].

8. DELAY($Arc_{pi \leftarrow pj}$): represents the set of delay values from the pin pi to the pin pj. The delay itself is a parameter which may take on any of the values in the set or other values. The delay is a function of the input slew applied at pi and the output load applied at pin pj; that is, the delay is based on the input slew subject to the output load. Because a delay value is preferably provided in the set for each combination of input slew and output load in their respective sets, if the number of elements in INSLEW($Arc_{pi \leftarrow pj}$) is N and the number of elements in LOAD($Arc_{pi \leftarrow pj}$) is M, then normally the number of elements in DELAY($Arc_{pi \leftarrow pj}$) is N×M. It is preferable to store these elements in a two-dimensional table, so that the relevant DELAY element can be found by its corresponding INSLEW and LOAD elements. The delay corresponding to the kth input slew and the lth load is therefore represented as DELAY($Arc_{pi \leftarrow pj}$)[k][l].

It can be seen that OUTSLEW($Arc_{pi \leftarrow pj}$) and DELAY ($Arc_{pi \leftarrow pj}$) will, in almost all timing arcs, occupy the majority of the data of the timing arc.

A timing arc and its attributes may be represented as follows: $Arc_{pi \leftarrow pj}$={pi, pj, $trans_{pi}$, $trans_{pj}$, INSLEW ($Arc_{pi \leftarrow pj}$), LOAD($Arc_{pi \leftarrow pj}$), OUTSLEW($Arc_{pi \leftarrow pj}$), DELAY($Arc_{pi \leftarrow pj}$)}. In this notation, it is assumed that the OUTSLEW($Arc_{pi \leftarrow pj}$) and DELAY($Arc_{pi \leftarrow pj}$) has been computed for the given {pi, pj, $trans_{pi}$, $trans_{pj}$, INSLEW ($Arc_{pi \leftarrow pj}$), LOAD($Arc_{pi \leftarrow pj}$)}. These attributes may be computed by a suitable delay calculation engine or the like, which are known in the art and for reasons of brevity will not be described here.

The source pin, source transition, and input slew may be thought of collectively as input parameters. The sink pin, sink transition, output load, output slew, and delay may be thought of collectively as output parameters. The output slew and delay may also be thought of collectively as dependent parameters, with values that are computed from the values of the input and/or output parameters. It is noted that, in some embodiments, other input or output parameters may be included in the timing arc, and other parameters may be dependent parameters.

During instantiation of the timing model under a selected input slew and output load, for any combination of predefined input slew and output load parameters, a computed output slew parameter and a computed delay parameter should be available. In an instantiation where the selected input slew or selected output load is not one of the predefined parameters, the output slew and delay may be interpolated from the nearest predefined parameters.

Any circuit path may be modeled as a timing arc, including interface paths and clock paths.

Preferably, when an interface path ends at a flip-flop, a setup arc is additionally modeled and associated with the clock path supplying a clock signal to that flip-flop or, in some embodiments, with the interface path itself. For instance, in the example circuit block of FIG. 1, interface path 11 ends at flip-flop 31 and is therefore modeled with clock path 17, which supplies the clock signal to the clock pin 31b of flip-flop 31. The interface path 11 is termed a setup path of the clock path 17, or a data path of the flip-flop 31, interacting with the clock path 17 at the flip-flop 31. Also, input pin 21 is termed a constrained pin, and clock pin 23 is termed a related pin. This arrangement is known in the art as a setup/hold check.

A setup arc is therefore generated to parametrically define one or more timing attributes related to the interaction of the data path and clock path. The setup arc may include a set of predefined input slews, preferably chosen to span the slew range in which the circuit block is anticipated to be instantiated, such that a plurality of alternate input slew parameters may be selected from for instantiation. To distinguish the two sets, the input slew parameters of the setup arc will be termed setup slew parameters hereinafter.

The setup slew parameters may be the same as or different from the input slew parameters of the timing arc of the clock path. However, even if the available input slew parameters and setup slew parameters are identical, due to factors such as differing path lengths, it is not the case that the result of a given input slew applied to the data path will necessarily interact at the flip-flop with the result of the same input slew applied to the clock path. Variance between applied input slew and applied setup slew at the flip-flop is therefore preferably accounted for.

The setup arc may further include a set of setup/hold values, representative of relative arrival times of signals from each source pin. As signals on the separate setup and clock paths may arrive at the flip-flop out of synch with each other, a setup/hold value is preferably applied to delay one until the other arrives, as it is desirable to read the data of the data path in synch with the clock signal of the clock path. Each setup/hold value is a function of the input slew applied at the input pin of the clock path and the setup slew applied at the input pin of the setup path. Because a setup/hold value is preferably provided for each combination of input slew and setup slew, if the number of input slew parameters is $N_1$ and the number of setup slew parameters is $N_2$, then normally the number of setup/hold values in the setup arc is $N_1 \times N_2$. It is preferable to store these values in a two-dimensional table, so that the relevant setup/hold value can be found by its corresponding input slew and setup slew.

An extracted timing model (ETM) is a modeled representation of the timing of the interface paths of a given block. Other forms of timing models exist in the art, and those of skill in the art will be able to adopt the proposed systems and methods to these other models. However, for reasons of brevity, an ETM-based modeling system will be assumed hereinafter.

An ETM is typically modeled in Synopsys Liberty Library (.lib) format or other such suitable format known in the art. The purpose of the representation of the timing of the given block is to retain only that information of the given block which may have an impact on the circuit paths of the other blocks or the circuit paths at the top. Therefore, the ETM does not capture, for example, the timing of the paths between two flip-flops in the given block, such as data path 13, since these paths are fully contained inside the given block. Additionally, ETMs typically replace the interface logic, such as logic 41 of interface path 11, of a circuit block with context-independent timing relationships between the source pin and sink pin of the path as a whole. The ETM is extracted such that when the ETM is instantiated in a top level simulation for testing and analysis, the timing of the interface paths should be the same as if the given block was instantiated instead of the ETM. ETMs are important in the digital implementation and the sign-off flow, since the compact representation of the timing of the given block in the ETM saves runtime and memory requirements for the analysis at the top-level. ETMs also help in IP re-use, concurrent design development of different blocks, and hiding of a given block's details.

It is noted that there may be numerous different circuit paths of different intermediate pins starting at a given source pin and concluding at a given sink pin, each with their own timing characteristics and timing arc. As STA is generally focused on determining a floor of the timing of the circuit, rather than consider all such circuit paths, it is preferable for a timing model to consider only a worst-case path for each combination of source pin and sink pin: that is, the circuit path requiring the most time for a signal from the source pin to the sink pin. The resulting analysis then provides the worst-case timing for the circuit block while allowing a more compact timing model. Any suitable process known in the art may be employed to identify such worst-case path. Hereinafter, when the timing attributes or timing arc of a circuit path is described, it is assumed, unless otherwise stated, that the worst-case path from the source pin to the sink pin is the specific circuit path being considered. For instance, the timing of interface path 11 in the example circuit block of FIG. 1 preferably represents the timing of the worst-case path from input port 21 to data pin 31a, regardless of other circuit paths available through the logic 41 therebetween.

Methods of extracting ETMs from a circuit design are well-known in the art and will not be described in detail, other than to the extent necessary to describe certain features and aspects in connection with illustrative implementations of the disclosed embodiment. Two common methods for extracting ETMs are graph reduction and path enumeration. An adaptation of path enumeration is preferable for the disclosed embodiment and will be assumed for the purposes of the description to follow. However, those of skill in the art will be able to adopt the principles herein to graph reduction as well as other suitable methodologies.

In shortened form, path enumeration operates by (for each circuit path to be modeled): identifying the worst-case path and its sequence of pins; determining timing attributes (such as input slew and output load elements) applicable the source and sink pins; computing timing attributes (such as output slew and delay elements) from one pin to the next to extract a pin-to-pin timing arc; and merging these pin-to-pin timing arcs into a complete timing arc for the circuit path. The resulting timing arc therefore parametrically defines the timing attributes of the entire circuit path. A corresponding setup path may also be modeled in the same manner and included in the timing arc, although for reasons of brevity this additional modeling will be omitted from the descriptions to follow. The complete resulting set of timing arcs, one arc for each circuit path to be modeled, is then stored to an ETM.

The computing of the timing attributes is sometimes referred to in the art as "characterizing" the path.

It should be noted that the above descriptions assume the characterization of a circuit path representing a series of pins in sequence. This will continue to be assumed for the remainder of this disclosure, to simplify illustration of the principles herein. However, the characterization of certain non-sequential arcs such as port-to-port combinational arcs, interface check arcs, and so forth require other, if similar, characterization methods. As these methods are also well-known, it will be within the understanding of those of skill in the art to adapt the disclosed principles to these other methods.

Figure 2:
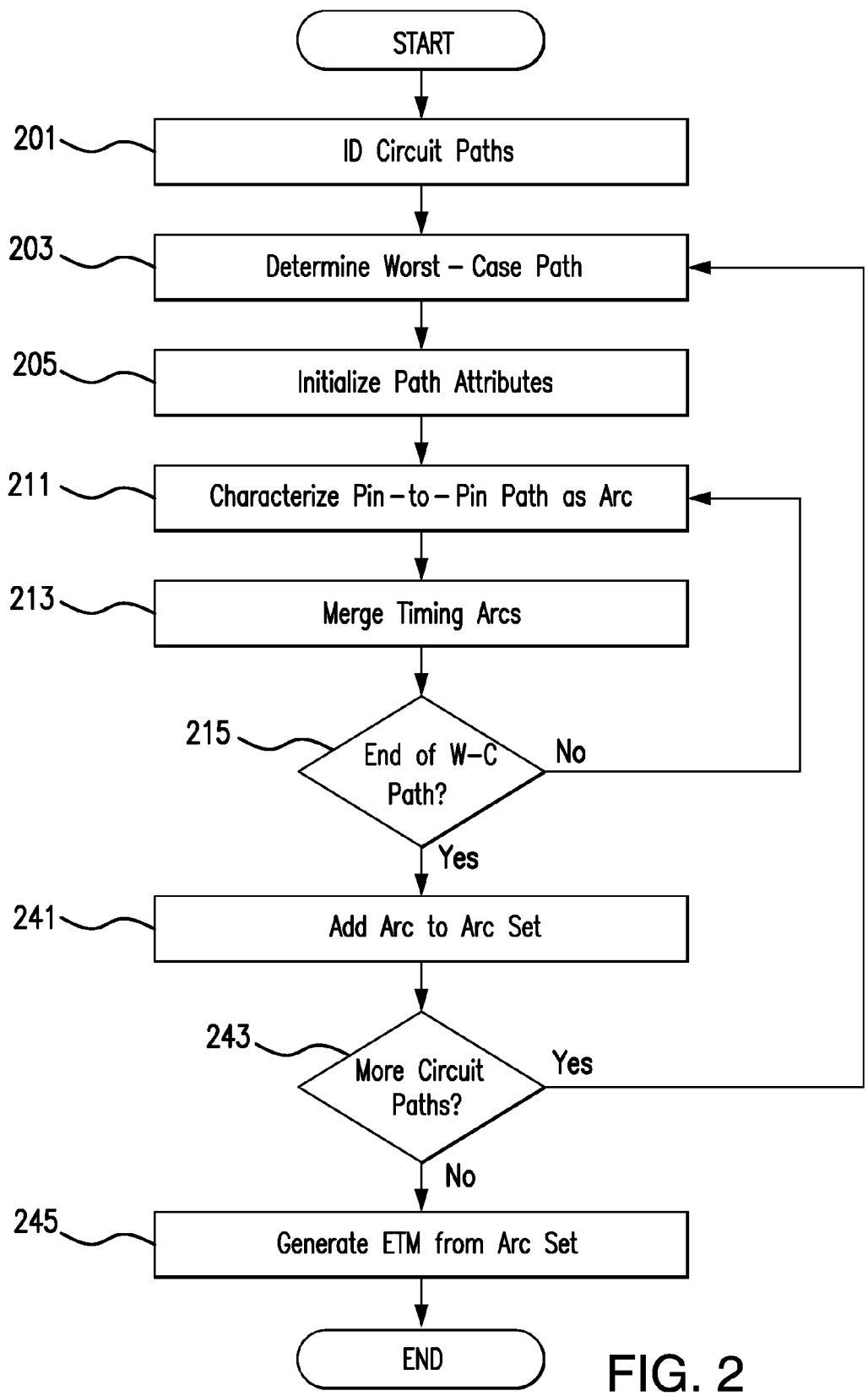
FIG. 2 is a block flowchart generally illustrating a path enumeration process for a circuit block.

FIG. 2 is a flowchart generally illustrating a path enumeration process for a circuit block. It is noted, however, that this process is described only as an example, and that many other processes, using path enumeration or otherwise, may be adapted to the principles herein.

At 201, the circuit block is analyzed to identify all circuit paths to be modeled; usually, all interface paths and clock paths. One of these circuit paths is selected at 203 and a worst-case path is determined. General timing characteristics for this worst-case path are determined and initialized at 205; the applicable sets of alternate input slew and alternate output load parameters are also preferably initialized at this time.

At 211, timing attributes between two pins of the worst-case path are determined, and a pin-to-pin timing arc is generated therefrom. As described previously, the timing attributes include an input (source) pin, an output (sink) pin, rising and falling transitions at both pins, and one or more values or elements for input slew, output load, output slew, and delay. This process may be known as characterizing a pin-to-pin path.

Methods of computing these timing characteristics are known in the art and may, as previously noted, in part use a suitable delay calculation engine or the like. It is noted that the input slew elements for the pin-to-pin timing arc sharing a source pin with the worst-case path itself (a first pin-to-pin timing arc) is the set of input slews applicable to the path itself, and the load elements for the pin-to-pin timing arc sharing a sink pin with the worst-case path itself (a final pin-to-pin timing arc) is the set of loads applicable to the path itself. (All but the final pin-to-pin timing arc will have only one applicable load value, which will be computed independently.)

Additionally, the output slews of a previous pin-to-pin timing arc become the input slews of the current pin-to-pin timing arc, and the output slews of the current pin-to-pin timing arc are computed based at least in part on these input slews, as well as the load or loads of the pin-to-pin timing arc. It is noted that all but the final pin-to-pin arc have only one load element, but the final pin-to-pin arc will have the set of load elements of the circuit path. Therefore, although the number of output slews for the current pin-to-pin timing arc is the number of input slew elements multiplied by the number of load elements, for all but the final iteration of block 211, this is equal to the number of input slew elements alone.

The pin-to-pin circuit paths are preferably selected and characterized serially along the length of the worst-case path, from a current pin to a following pin. That is, a first iteration of block 211 characterizes the circuit path between the input (source) pin of the entire worse-case path and a pin later in the worse-case path, the second iteration preferably characterizes the circuit path between that later pin and a pin yet further down the worse-case path, and so forth until a final pin-to-pin circuit path, sharing a sink pin with the worst-case path itself, is characterized.

It is noted, however, that a pin-to-pin circuit path may have intermediate pins between its source and sink. For instance, in some embodiments, each pin-to-pin circuit path may be a stage path, where the source pin is the input pin of a circuit stage, and the sink pin is the input pin of the circuit stage immediately following in the worst-case path.

The newly generated pin-to-pin timing arc is then merged with another timing arc at 213, the other arc representing the entire worst-case path up to the source pin of the new pin-to-pin timing arc. This other arc, prior to the merge operation, may be termed an "unmerged" arc, and after the merge operation may be termed a "merged" arc. For the first iteration of block 213, the unmerged arc does not exist yet, and therefore the so-called merged timing arc is simply the new (first) pin-to-pin timing arc. For a second or later iteration, since the new pin-to-pin arc is serially oriented with the unmerged timing arc, the following computations may be used for the characteristics of the merged timing arc:

The source, source transition, and input slew values are unchanged from the unmerged arc to the merged arc. In practice, this means that all three attributes will remain the attributes of the first pin-to-pin timing arc, between the source pin of the entire circuit path and the pin following, throughout all merges.

The sink, sink transition, load, and output slew values of the merged arc are set to the corresponding values of the new pin-to-pin arc. In practice, this means that all four attributes will eventually become the attributes of a final pin-to-pin timing arc, between the sink pin of the entire circuit path and the pin prior, as of the final merge.

Each delay value, for each input slew and load element of the pin-to-pin arc, of the merged arc is the sum of the delay of the unmerged arc to for the given input slew element and the first load element with the delay of the pin-to-pin arc for the given input slew and load elements. It is noted that all but the final pin-to-pin arc have only one load element, but the final pin-to-pin arc will have the set of load elements of the circuit path. Therefore, although the number of delay values is the number of input slew elements multiplied by the number of load elements, for all but the final iteration of block 213, this is equal to the number of input slew elements alone.

As noted previously, for convenience this disclosure assumes a linear sequence of pins. Especially for circuit paths or desired arcs where this is not the case, other methods of dividing the circuit path and merging the resulting timing arcs may be more preferable.

It is then determined, at 215, if the end of the worst-case path has been reached (that is, if the pin-to-pin timing arc that was just merged was the final pin-to-pin timing arc). If not, the process returns to block 203 to characterize the next pin-to-pin circuit path. Otherwise, the entire worst-case path has been characterized in the merged timing arc, and the process therefore continues to 241 where this timing arc is converted to an ETM arc and added to a set of ETM arcs. The ETM arc may be identical to the timing arc, or it may be a data structure containing additional data about the arc, such as applicable constraints (e.g. a clock source, or a power or ground line).

The process then checks, at 243, whether there are more circuit paths from the set identified in block 201 that have not yet been characterized and converted into an ETM arc. If there are, the flow returns to block 203 and generates another timing arc for a newly selected circuit path. If, however, all circuit paths have been characterized, an ETM is generated from the completed set of ETM arcs at 245. Techniques for generating a complete ETM from a set of ETM arcs are well-known in the art and will not be detailed here. With the ETM generated, the process ends.

2. Waveforms

Each input slew element of INSLEW($Arc_{pi \leftarrow pj}$) for a timing arc $Arc_{pi \leftarrow pj}$ is, in simple cases, represented by a single time value, which may be termed the slew time, and which expresses the time for the voltage entering pi to go from a designated low value to a designated high value, or vice versa, when the signal value changes. The same is true of each output slew element of OUTSLEW($Arc_{pi \leftarrow pj}$), for the voltage exiting pj. This representation is based on an assumption that the voltage rises or falls at a constant rate, which for older circuits is sufficiently accurate for simulation purposes. Since the low and high values are predesignated, this rate can be directly determined from the slew time.

However, advanced process nodes, due to both their speed and irregular rise/fall patterns, increase the need for precision in determining the voltage value at a given moment. Input and output slews may therefore be reflected in waveforms, each of which includes a selected number of piecewise linear time/voltage pairs representing samples of the waveform. These linear time/voltage pairs, when considered together as a waveform, characterize the voltage change over time at the pins more precisely than the single time value of earlier models.

Each time/voltage pair preferably includes a time value t and a voltage value v representing a sample at the relevant pin. Either v or t may be the independent value, depending on the embodiment; that is, the voltage v may be sampled at each of a series of predetermined time values, or the time t may be sampled as the voltages reaches each of a series of predetermined voltage values. For a waveform W, the number of time/voltage pairs may be denoted as |W|. Typically, for sufficient accuracy, |W| is of the order of 10. The time value for an ith sample of waveform W may be denoted as time(W, i) and the voltage value for an ith sample of waveform W may be denoted as voltage(W, i).

Additionally, time(W, v) may be used to denote the time at which the waveform W is at a voltage v, and voltage(W, t) may be used to denote the voltage of the waveform at a time t. In either case, a sample for the provided time or voltage may not be available in the waveform, and therefore the necessary value is computed using interpolation.

At each stage of a circuit path, the shape of an input waveform (representing an input slew) driving a stage has a significant effect on the delay and the shape of the corresponding output waveform of the stage (representing the output slew). Traditionally, for a given input slew time of a cell, delay computation makes use of the corresponding single pre-driver waveform defined in the library to compute the output slew time of the cell. However, even with the same input slew time, different input waveform shapes can produce different delays and different output waveform shapes. Therefore, in order to ensure the accuracy of the timing model, the set of waveforms rather than the set of slew times needs to be taken into account by the model extractor.

Hereinafter, the terms "input slew" and "output slew" may refer both to the predefined parameters and to the waveforms representing them.

The production of an output waveform based on an input waveform is known as waveform propagation. Waveform propagation in the proposed methodology is simulated by computing the output waveforms for a pin-to-pin arc, each based on the corresponding input waveforms. The output waveforms of $\text{Arc}_{pi \leftarrow pi+1}$ then become the input waveforms for $\text{Arc}_{pi+1 \leftarrow pi+2}$. The output waveforms may be computed taking into account current-source based delay models defined for the cells in the library, the complex interconnect structure, non-linear pin capacitance, and Miller-feedback during delay calculation, by employing an advanced delay calculation engine. These waveforms are stored during model extraction to facilitate actual waveform propagation through the pins of the complete circuit path and maintain the accuracy of the generated timing model.

It is noted that these waveforms are data representations, and therefore it is not literally accurate to say that a single waveform travels or propagates from pin to pin; instead, for a given pin, a waveform with new time/voltage pairs is computed by applying a propagation function to a waveform at a previous pin. However, as these waveforms represent characteristics of a real signal traveling from pin to pin, for convenience this disclosure will sometimes describe the waveforms as having the same behavior. That is, if a waveform for a pin results from propagation computations applied to a waveform for a previous pin, the two waveforms will be referred to as if they were the same waveform, having traveled from pin to pin and "undergoing propagation" in the process.

Even a waveform of low resolution tends to contain an order of magnitude more data than a slew time representation, and therefore requires correspondingly more data storage. As shown previously, for a completed timing arc, the number of output slews in particular is the number of input slew elements multiplied by the number of load elements, and therefore already requires a considerable percentage of the space of the timing arc. When these output slews are represented by waveforms, the data storage size of the resulting timing arc has been determined to be, on average, 20 times larger than a timing arc of the same circuit path using conventional slew time representation.

Furthermore, computing an output waveform from an input waveform is both runtime-intensive and memory-intensive, and must be repeated for each input waveform at each pin-to-pin arc to arrive at the output waveforms of the final pin-to-pin arc.

In accordance with certain aspects of the present invention, both problems are addressed by reducing the number of sampled waveforms necessary to compute for, and/or store in, a timing arc, and doing so effectively without unduly compromising accuracy. An illustrative approach toward that end is described below.

3. The Waveform Invariant Node

Figure 3A:
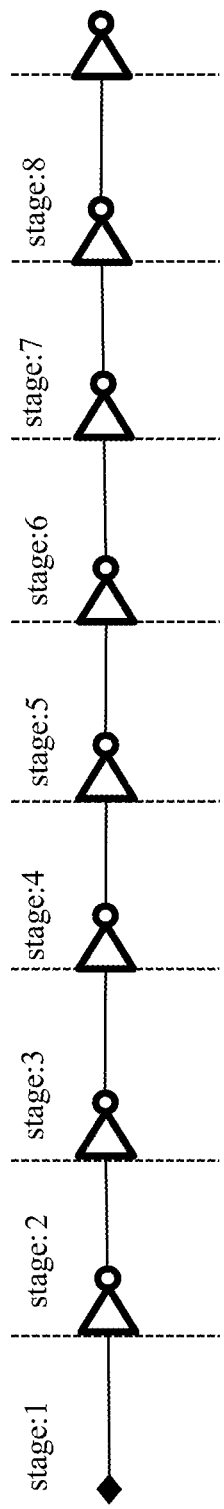
FIG. 3A is a circuit diagram illustrating an example circuit path.
Figure 3B:
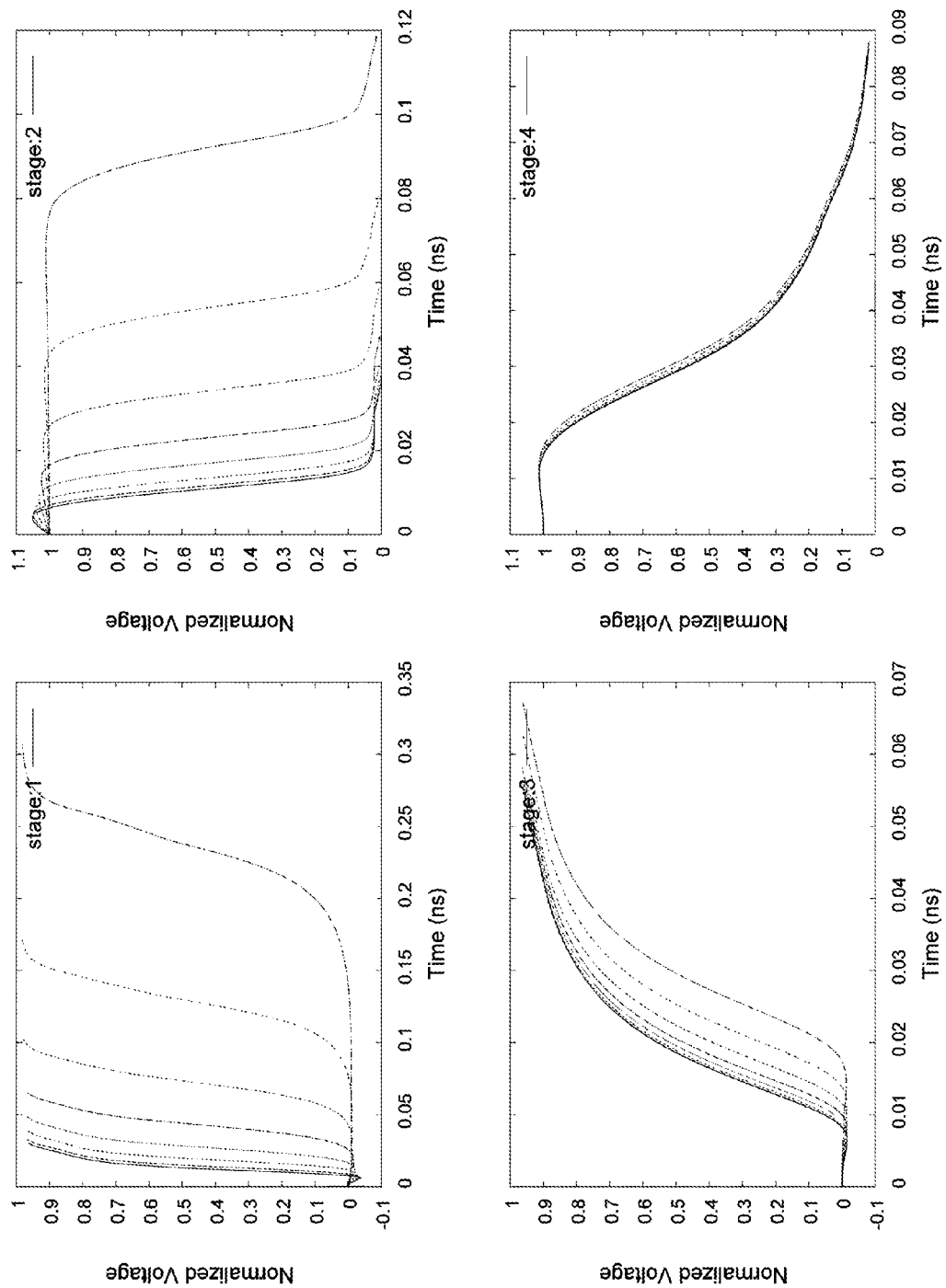
FIGS. 3B and 3C are a series of graphs illustrating sets of waveforms representing change in voltage over time.
Figure 3C:
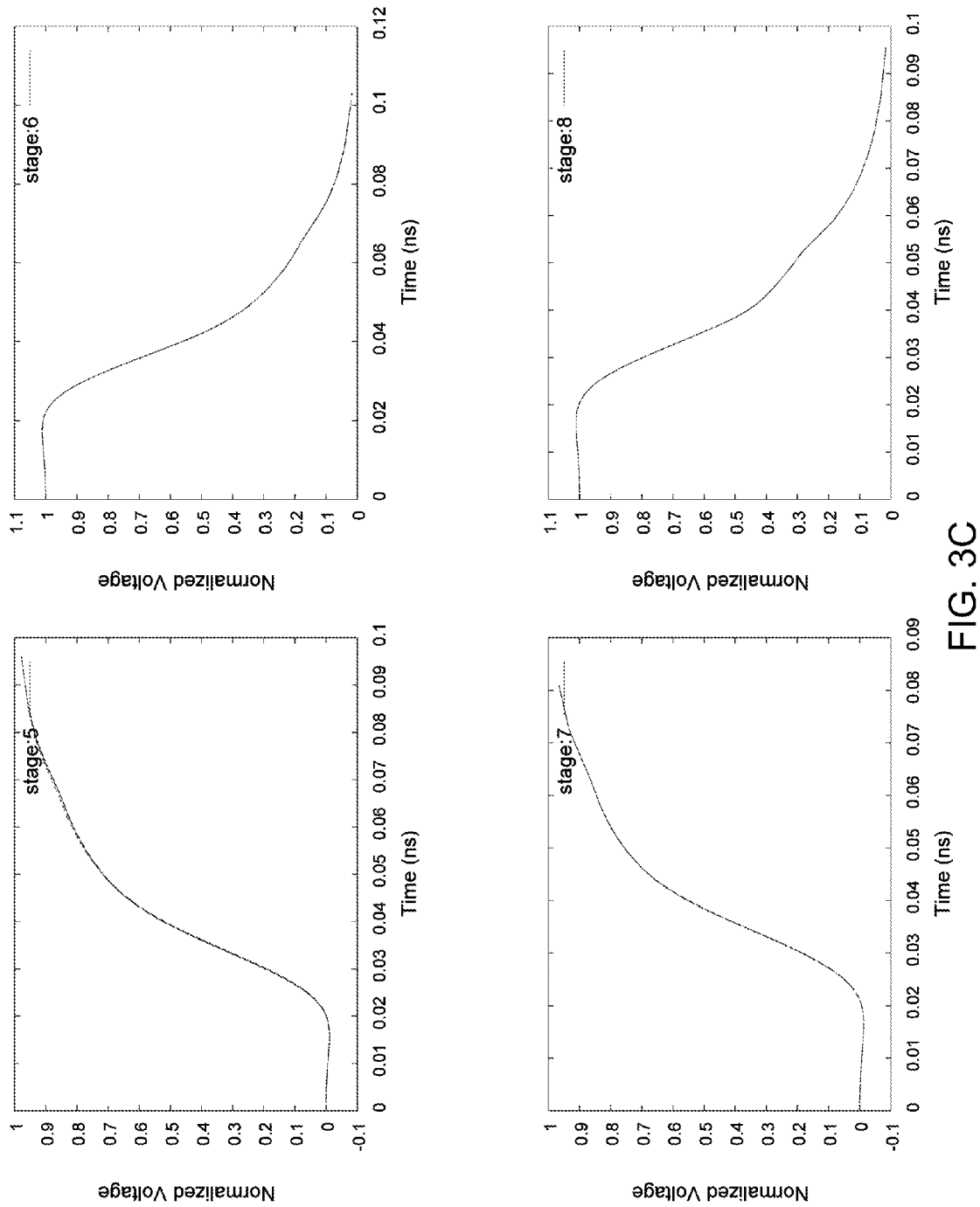

FIG. 3A depicts a simple circuit path, where a first stage is a source pin and the output connection following, and each stage thereafter is an inverter and the output connection following. FIGS. 3B and 3C depict a set of waveforms propagating through the path and sampled at the input pin of each stage of the path.

As seen in FIGS. 3B and 3C, a set of input waveforms, each corresponding to one of a set of differing input slew parameters, are inputted at the input pin of Stage 1 (that is, the source pin of the path). At Stage 1, the waveforms have a clear mutual variation with respect to one another. The degree of mutual difference, or average variation, in these waveforms may be called a waveform variation parameter at the source pin, or an initial waveform variation parameter on the circuit path.

The waveforms then propagate through the circuit path, and a waveform stabilization phenomenon may be observed. As is seen in FIGS. 3B and 3C, as the distinct waveforms propagate through the pins and stages of the circuit path, the mutual difference in the propagated waveforms reduces. In other words, the waveform variation parameter for a signal approaches zero as the waveforms propagate through successive stages of the circuit path. In this example, by the input pin of the fourth stage, the waveforms are noticeably similar, and by the input pin of the sixth stage, they have substantially converged such as to virtually represent the same uniform waveform.

Waveform stabilization is generally observable in circuit paths. The rate of stabilization may vary considerably, depending on the peculiarities of each cell on the path and, in some cases, of the connections therebetween. Quantifying this stabilization is therefore helpful in analyzing and modeling the path.

As noted previously, for the following equations, $|W|$ represents the number of time/voltage pairs in a waveform W, time(W, i) represents the time value for an ith sample of waveform W, time(W, v) represents the time at which the waveform W is at a voltage v, voltage(W, i) represents the voltage value for an ith sample of waveform W, and voltage (W, t) represents the voltage of the waveform at a time t.

A waveform variation measure, or WVM, is a quantification of the waveform variation parameter. When computed between two waveforms, the WVM employs a mean square difference of the individual samples of waveforms, computed at the sampling points of the first waveform. Specifically, for two waveforms $W_a$, $W_b$:

$$WVM(W_a, W_b) = \frac{1}{|W_a|} \sum_{i=1}^{|W_a|} \{\text{time}(W_a, \text{voltage}(W_a, i)) - \text{time}(W_b, \text{voltage}(W_a, i))\}^2 \quad \text{(Eq. 1)}$$

Interpolation may be necessary to determine the second time value, either when $W_b$ employs a different number of samples or when the sampling voltages in the two waveforms are different. Although linear interpolation may be employed for this purpose, other interpolation forms are also within the scope of this invention.

Equation 1 may now be expanded to determine a waveform variation measure at a pin for a plurality of waveforms. To determine the WVM between a set of N waveforms $\{W_1, W_2, W_3, \ldots W_N\}$ at a pin P:

$$WVM(P) = \frac{1}{N-1} \sum_{i=1}^{N-1} WVM(W_1, W_{i+1}) \quad \text{(Eq. 2)}$$

That is, WVM(P) represents an average of each two-waveform WVM computed between a first waveform at a pin P and each other waveform at P. It is noted that the selection of a "first" waveform is arbitrary, but is preferably consistent for all computations of WVM across all pins; that is, the "first" waveform at a pin should be the result of propagation of the "first" waveform of an earlier pin. It is also noted that, although the set of waveforms in this computation may include a waveform corresponding to each of a set of input slew parameters, in some embodiments where the number of input slew parameters is large, a sufficiently accurate WVM may be computed with only a subset of these waveforms.

The waveform variation measure is a simplistic and computationally straightforward representation of mutual variation in the waveforms. It can be computed efficiently in one traversal over the discrete sample points for the given set of waveforms. It is noted that the WVM has a dimension of time.

With the WVM for a set of waveforms at a pin quantified, a stabilization threshold, or stabilization tolerance ST, may be established to define when waveform stabilization has reached a level sufficient for a particular purpose. This stabilization tolerance ST is preferably predetermined generally for all circuits, although in some embodiments, it may be adjusted according to idiosyncrasies of a particular circuit. A waveform invariant node, or WIN, is then defined as the pin closest to the input pin where WVM(P)<ST.

The WVMs of the pins are preferably computed in the order of signal propagation from the input pin; in this manner, once a WVM of a pin is computed to be below the stabilization tolerance, the remaining pins may be ignored and the WIN may be selected immediately. To further reduce the number of WVM computations, in some embodiments only the input pins or output pins of each stage or each cell may be considered for selection as a WIN. However, in other embodiments, accuracy may be preferred over runtime savings at the WIN selection stage, and therefore the WVM will be computed and compared to the stabilization tolerance at every pin.

In summary, during propagation from the input pin to the WIN, a set of signal waveforms reduces in mutual waveform variation with respect to one another. At and beyond the WIN, the mutual waveform variation, as expressed by a waveform variation parameter, is within a predetermined stabilization tolerance, and the signal waveforms have substantially converged to a uniform waveform.

The stabilization tolerance ST is chosen carefully to avoid wrong or overly-conservative inferences of WIN in a given path. If ST is chosen to be too large, then a stage might be wrongly inferred as a WIN even when waveforms still show large variation at that pin. If ST is chosen to be too small, then a pin further away from the input will be inferred as a WIN, though waveform stabilization might have practically occurred at a pin much before the inferred WIN. Experimentation has determined that a stabilization tolerance ST of $1 \times 10^{-8}$ ns$^2$ is preferable. It is noted, however, that if a pin is a WIN, every pin following in the same circuit path may also serve as a WIN for the purposes that follow. Therefore, a stabilization tolerance lower than $1 \times 10^{-8}$ ns$^2$, by selecting a pin further down the path, may also determine an effective WIN.

With the waveform variation at or below the stabilization tolerance at the waveform invariant node and beyond, the plurality of waveforms are sufficiently converged to the uniform waveform such that the uniform waveform may be substituted for each of the plurality of waveforms without effective loss of accuracy. That is, once a WIN is defined, the uniform waveform, or propagations thereof, may be applied at the WIN and at all pins following, regardless of the corresponding waveform at the source pin. Illustrative applications of this substitution are described below.

4. Decomposition at the Waveform Invariant Node

By decomposing a timing arc of a circuit path into two timing arc components, the first timing arc component characterizing a path extending from the input pin to the waveform invariant node, and the second timing arc component from the waveform invariant node to the output pin, the total number of output slews and delay values defined in the timing arc can be substantially reduced. Specifically, by treating each component as a smaller timing arc, the output slews and delay values of the first component are subject only to a single output load, and the output slews and delay values of the second component are based only on a single input slew, as shown later in this section. This decomposition also potentially eliminates redundancy in partially-overlapping circuit paths, when a component is completely shared between the paths.

Timing arcs are typically modelled as functions of two independent variables, input slew s and output load 1. More specifically, the delay of the timing arc is such a function, and can be represented as:

$$\text{DELAY}(\text{Arc}_{p1 \leftarrow pn}) = f(s,l). \quad \text{(Eq. 3)}$$

It is well-known that a continuous function of two variables can be represented or approximated by a sum of two functions of one variable each; that is, $f(s,l) = \phi(s) + \psi(l)$ for some functions $\phi$ and $\psi$ of input slew and output load, respectively. There are several elegant methods known in the art to decompose a given two variable continuous function into sum of one variable functions, and Kolmogorov-Arnold representation theorem provides a theoretical foundation for the existence of a decomposition of general multivariable functions. However, in this case, since the original function $f(s, l)$ is extracted from a given circuit path of a circuit design, the distinctive dependency of this function on the independent variables, and the existence of a similar function at all the pins of this path, can be exploited to obtain the decomposition in a much simpler way.

A timing arc $\text{Arc}_{p1 \leftarrow pn}$ is obtained by characterizing the circuit path $P_{1 \leftarrow n}$. However, the same arc can be decomposed into two arcs at an intermediate pin pk in the path $P_{1 \leftarrow n}$ where 1<k<n, such that $$\text{Arc}_{p1 \leftarrow pn} = \text{Arc}_{p1 \leftarrow pk} + \text{Arc}_{pk \leftarrow pn} \quad \text{(Eq. 4)}$$

By extension, because the two arcs are serially oriented:

$$\text{DELAY}(\text{Arc}_{p1 \leftarrow pn}) = \text{DELAY}(\text{Arc}_{p1 \leftarrow pk}) + \text{DELAY}(\text{Arc}_{pk \leftarrow pn}) \quad \text{(Eq. 5)}$$

Which in combination with Equation 5, and using the input slew and output load elements at pin pk, results in:

$$f(s,l) = f(s, \text{load}(pk)) + f(\text{input-slew}(pk), l) \quad \text{(Eq. 6)}$$

However, because pk is not the output (sink) pin pn, load(pk) is a single, fixed value which can be computed. Additionally, if pin pk is a waveform invariant node (WIN), then input-slew(pk) also has only one possible value, the uniform waveform, which can also be computed. This means that only s remains variable in the first half of the function while 1 is a constant, and only 1 remains variable in the second half while s is a constant. Therefore, each half of the function may be re-expressed to obtain:

$$f(s,l) = \phi(s) + \psi(l) \quad \text{(Eq. 7)}$$

Thus, by selecting a WIN as a decomposition point for a circuit path, the delay of the circuit path can be represented as two single-variable functions instead of one two-variable function. When a delay value is otherwise needed for each combination of multiple values of both input slew and output load, this decomposition reduces the number of delay values considerably, as will be elaborated on below.

It will be obvious that the function for OUTSLEW ($Arc_{p1 \leftarrow pn}$), also having input slew and output load as variables, may be decomposed for a circuit path at a WIN in the same manner. The same will be true of any other functions that have both input slew and output load as variables.

Figure 4A:
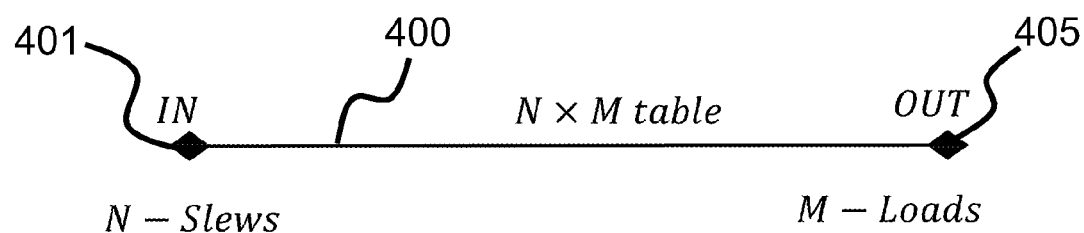
FIGS. 4A and 4B are circuit diagrams illustrating an example circuit path before and after selection of a waveform invariant node, in accordance with an embodiment of the present invention.
Figure 4B:
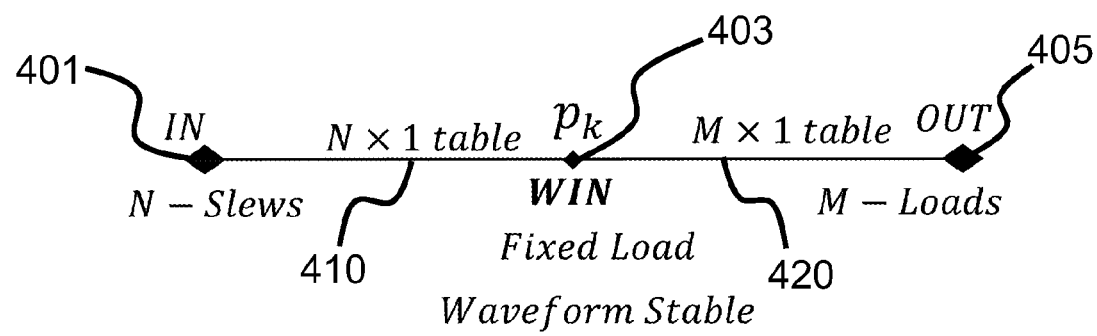

FIGS. 4A and 4B depict a circuit path before and after selection of a waveform invariant node, in accordance with an embodiment of the present invention.

Initially, as depicted in FIG. 4A, a circuit path 400 has an input (source) pin 401 and an output (sink) pin 405. An intermediate pin on the circuit path 400 is identified and selected as a WIN 403 for the path, as depicted in FIG. 4B. As noted earlier, a circuit path may be thought of as two shorter circuit paths where the output pin of the first path is the input pin of the second. Therefore, the circuit path 400 may be split at the WIN 403 and decomposed into a first path portion 410, extending from the input pin 401 to the WIN 403, and a second path portion 420, extending from the WIN 403 to the output pin 405.

Each path portion may then be characterized as its own timing arc, or timing arc component, and the two timing arcs will be treated as serially oriented in the final timing model when the complete circuit path is subsequently modeled by the timing model.

The number of output slews, or output waveforms, necessary for a second timing arc which represents the second path portion 420 is M, rather than N×M. This is because the second path portion 420 begins at the WIN 403, where there is only one applicable input slew, the uniform waveform, and therefore the number of input slews N is reduced to 1. Additionally, for the first path portion 410, the number of loads M is reduced to 1, because the first path portion 410 concludes at the WIN 403 where the load is fixed. In other words, the number of output slews, or output waveforms, necessary for a first timing arc which represents the first path portion 410 is N, rather than N×M. A total number of waveforms to be stored in a complete timing model having the decomposed first and second timing arcs is therefore N+M, rather than N×M for the undecomposed timing arc resulting from circuit path 400.

In this manner, a two-dimensional table within a conventional timing arc is reduced to a one-dimensional table in each of the proposed pair of timing arc components, both reducing disk space and simplifying any interpolation of values or elements not in the tables.

In a similar fashion, the number of delays characterized for a timing arc is likewise dependent on the number of input slews and output loads, and is similarly reduced from N×M to N+M according to this decomposition process. The same will be true of any other timing attributes that are computed from both input slew and output load.

Figure 5A:
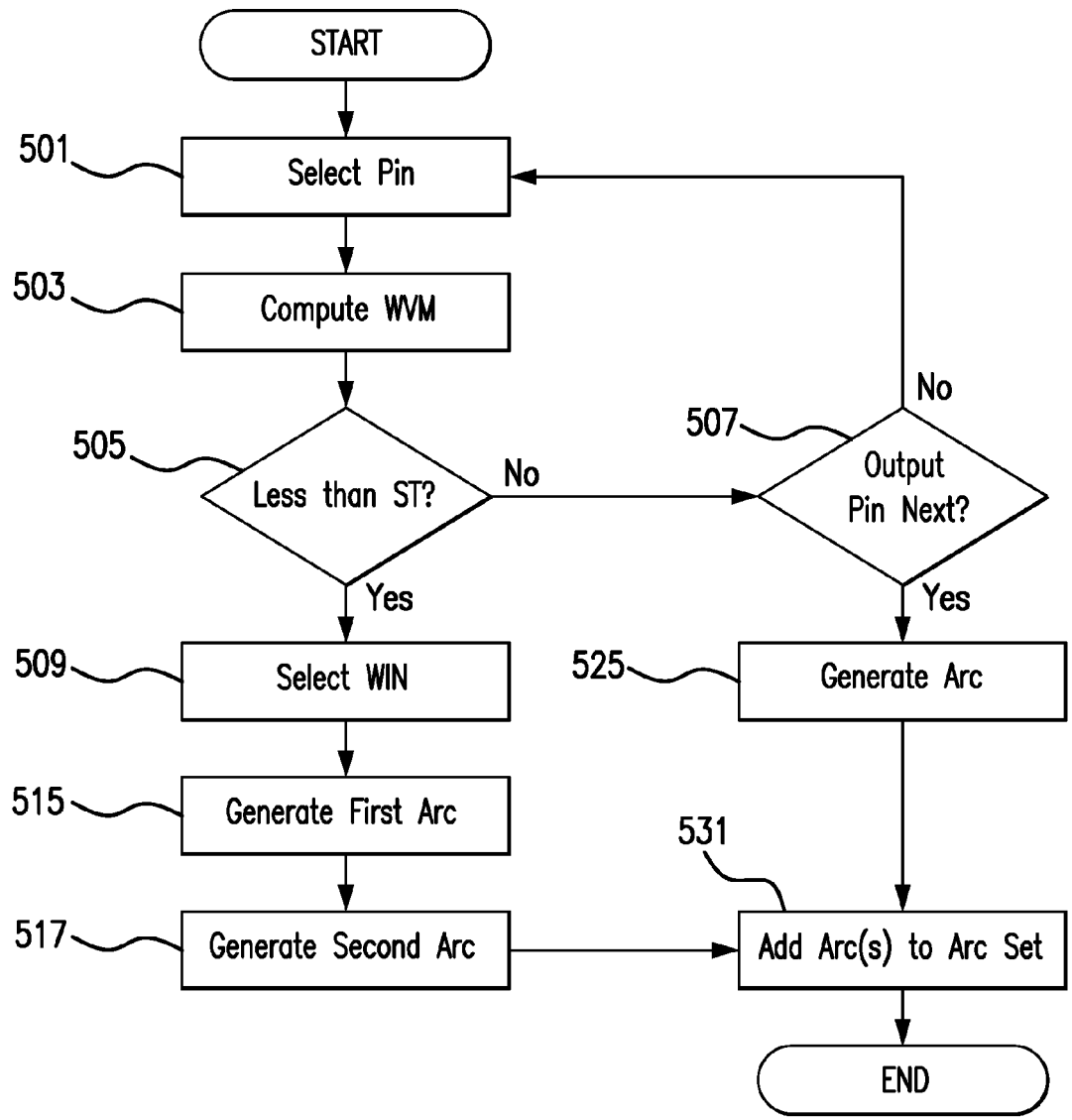
FIG. 5A is a block flowchart illustrating a method of selecting a waveform invariant node and generating timing arcs for a circuit path, in accordance with an embodiment of the present invention.

FIG. 5A is a flowchart illustrating a method of selecting a waveform invariant node and generating a timing arc, in accordance with an embodiment of the present invention.

At 501, a pin in the circuit path is selected. The waveform variation measure WVM for this pin is computed at 503, and at 505 it is determined whether the WVM is below the stabilization tolerance. If it is not, it is determined whether the next pin in the circuit path is the output pin, at 507, and if not, the flow returns to block 501 to select the next pin. It is again noted that the "next" pin may not be the pin immediately following on the circuit path in all embodiments, but may be, for instance, the input pin of a next stage.

If at block 507 it is determined that the output pin is reached, no WIN is present in the circuit path, and the flow proceeds to 525, where the circuit path is characterized as a single timing arc. This may be accomplished through any characterization process, such as the one depicted in FIG. 2. This timing arc is added to an arc set at 531, which will be employed to generate an ETM, such as shown in block 245 of FIG. 2. The method then ends, and may then be repeated for another circuit path if needed.

If block 505 determines that the WVM at the pin is below the stabilization tolerance, the pin is identified and selected as a WIN for the circuit path at 509, and the input slew and output load for the WIN are computed. The input slew for the WIN is simply the uniform waveform. Because the waveforms used to compute the WVM at the WIN have substantially converged to the uniform waveform, any of them may be selected as the uniform waveform. Methods of computing the output load for an intermediate pin of a circuit path are known in the art and, for brevity, will not be detailed herein.

A first path portion from the input pin to the WIN, which may be termed a pre-WIN path, is characterized as a first timing arc at 515, using the single output load of the WIN for all load-based computations such as the output waveforms and delay values. Likewise, a second path portion from the WIN to the output pin, which may be termed a post-WIN path, is characterized as a second timing arc at 517, using the single input slew of the WIN (the uniform waveform) for all input slew-based computations such as the output waveforms and delay values. Both characterizations may be accomplished through any characterization process, such as the one depicted in FIG. 2.

These two timing arcs are then both added to an arc set at 531, which will be employed to generate an ETM, such as shown in block 245 of FIG. 2. In a subsequent representation of the circuit path by the ETM, the ETM will treat the first and second timing arcs as serially oriented, recombining them into the complete circuit path. Various approaches to adapting the ETM to associate each pair of first and second arcs with the original circuit path will be apparent to those of skill in the art and, for brevity, are not further detailed herein. However, it is noted that the conversion from a timing arc to an ETM arc, such as shown in block 241 of FIG. 2, may include adding association markers to the arc which will be employed in the generation of the ETM.

The process then ends, and may then be repeated for another circuit path if needed.

Figure 6A:
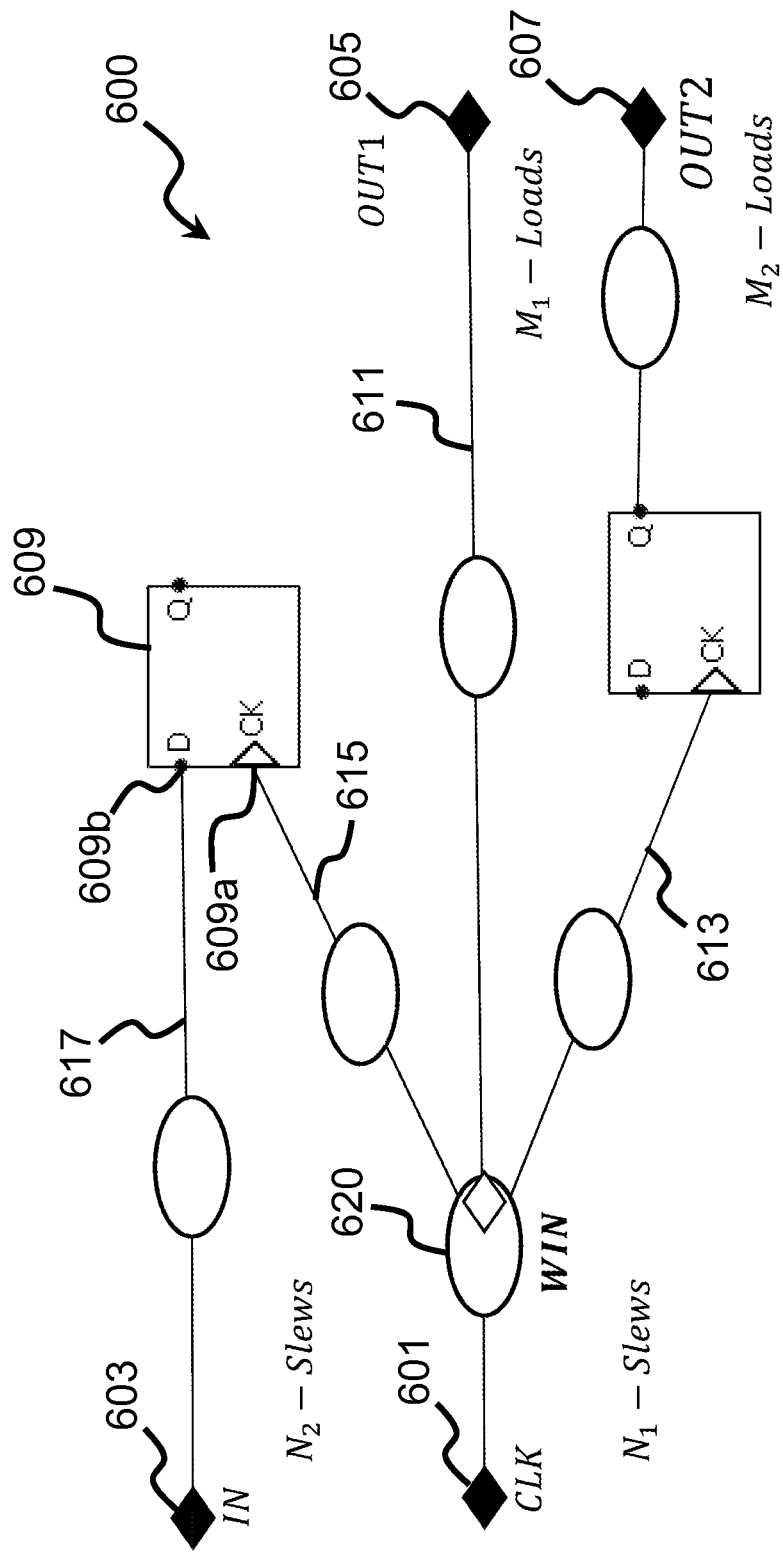
FIG. 6A is a block diagram illustrating an example circuit block with multiple related paths.

When a circuit block contains more than one path, still more reductions may be realized. FIG. 6A depicts a circuit block 600 with multiple paths. A first circuit path 611, which in this case is a combinational path, begins at a source pin 601, which in this case is a clock pin, and concludes at a first output pin 605. A second circuit path 613, which in this case is a sequential path, shares the source pin 601 with the first circuit path 611, but branches to pass through a flip-flop and conclude at a second output pin 607.

Additionally, a clock path 615 also shares the source pin 601 with the first circuit path 611, which as noted is a clock pin, and concludes at a clock pin 609a of a flip-flop 609, while a data path 617 begins at another source pin 603 and concludes at a data pin 609b of flip-flop 609. As explained previously, this forms a setup/hold check arrangement and makes data path 617 a setup path of clock path 615.

For this circuit block, $N_1$ represents a number of predefined input slews at the source (clock) pin 601, $N_2$ represents a number of predefined input (setup) slews at the source (data) pin 603, $M_1$ represents a number of predefined output loads at the first output pin 605, and $M_2$ represents a number of predefined output loads at the second output pin 607.

Figure 6B:
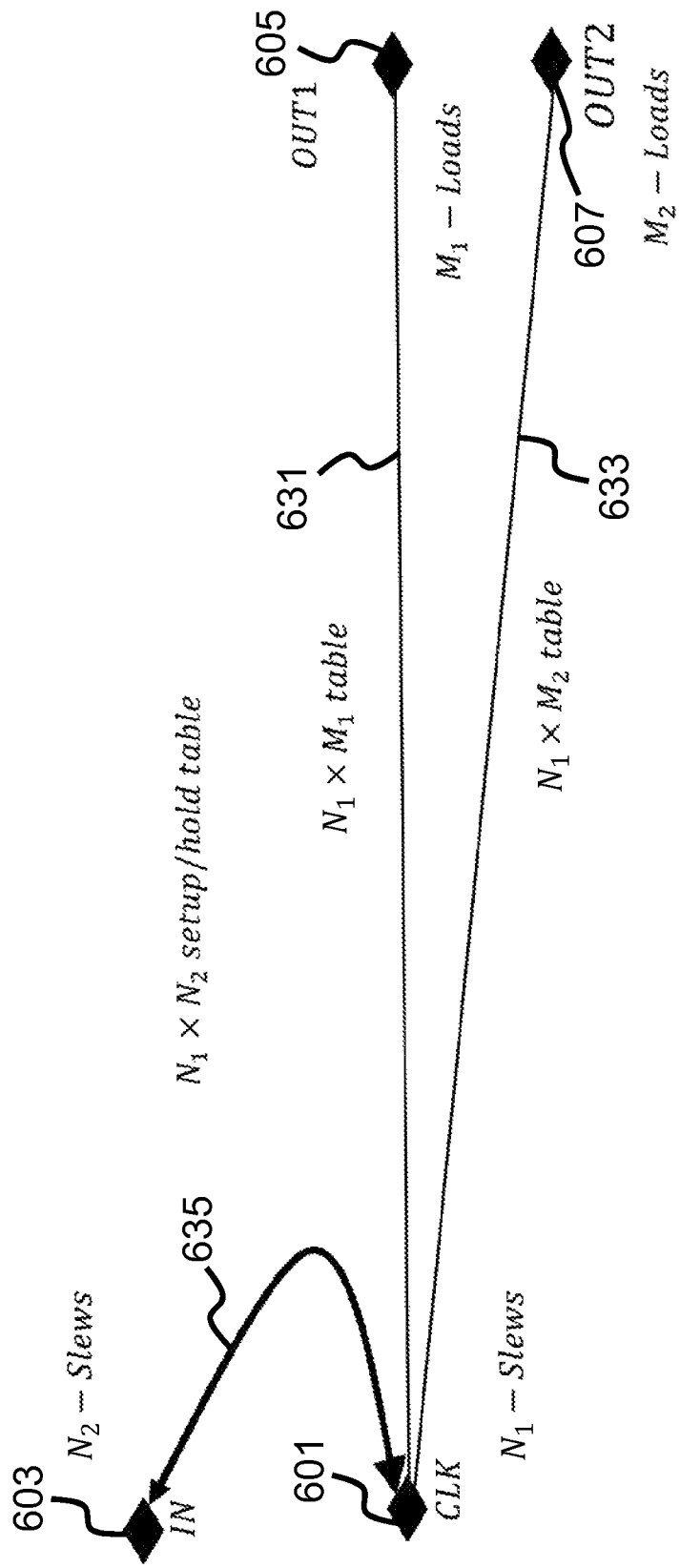
FIG. 6B is a diagram of timing arcs conventionally representing the paths of FIG. 6A.

A conventional representation of the circuit block 600 is shown in FIG. 6B. A first timing arc 631 is generated to characterize the entire first circuit path 611 from source pin 601 to first output pin 605, and a second timing arc 633 is generated to characterize the entire second circuit path 613 from source pin 601 to second output pin 607. The first timing arc 631 will have $N_1 \times M_1$ output slew elements and $N_1 \times M_1$ delay elements, and the second timing arc 633 will have $N_1 \times M_2$ output slew elements and $N_1 \times M_2$ delay elements.

The arrangement of clock path 615 and data path 617 may be further modeled by a setup arc 635, with source (input) pin 603 being the constrained pin, and source (clock) pin 601 being the related pin. As previously described, the setup/hold values of setup arc 635 are dependent on the input slews at each end. Therefore, for reasons similar to the output slew of other timing arcs, the setup arc will have $N_1 \times N_2$ such values.

Returning to FIG. 6A, a waveform invariant node (WIN) 620 has been selected for the first circuit path 611. Although this will not be the case for all circuit paths in all circuit blocks, here the WIN 620 is also part of the second circuit path 613 and the clock circuit path 615. Because all three circuit paths also share the same source (input) pin 601 and thereby the same initial input waveforms, as well the portion of the path 610 between the source pin 601 and the WIN 620, the same WIN selection process will find WIN 620 to be the WIN for the second circuit path 613 and the clock circuit path 615. Therefore repeating the WIN selection process for these paths is unnecessary, allowing the conservation of runtime.

Figure 6C:
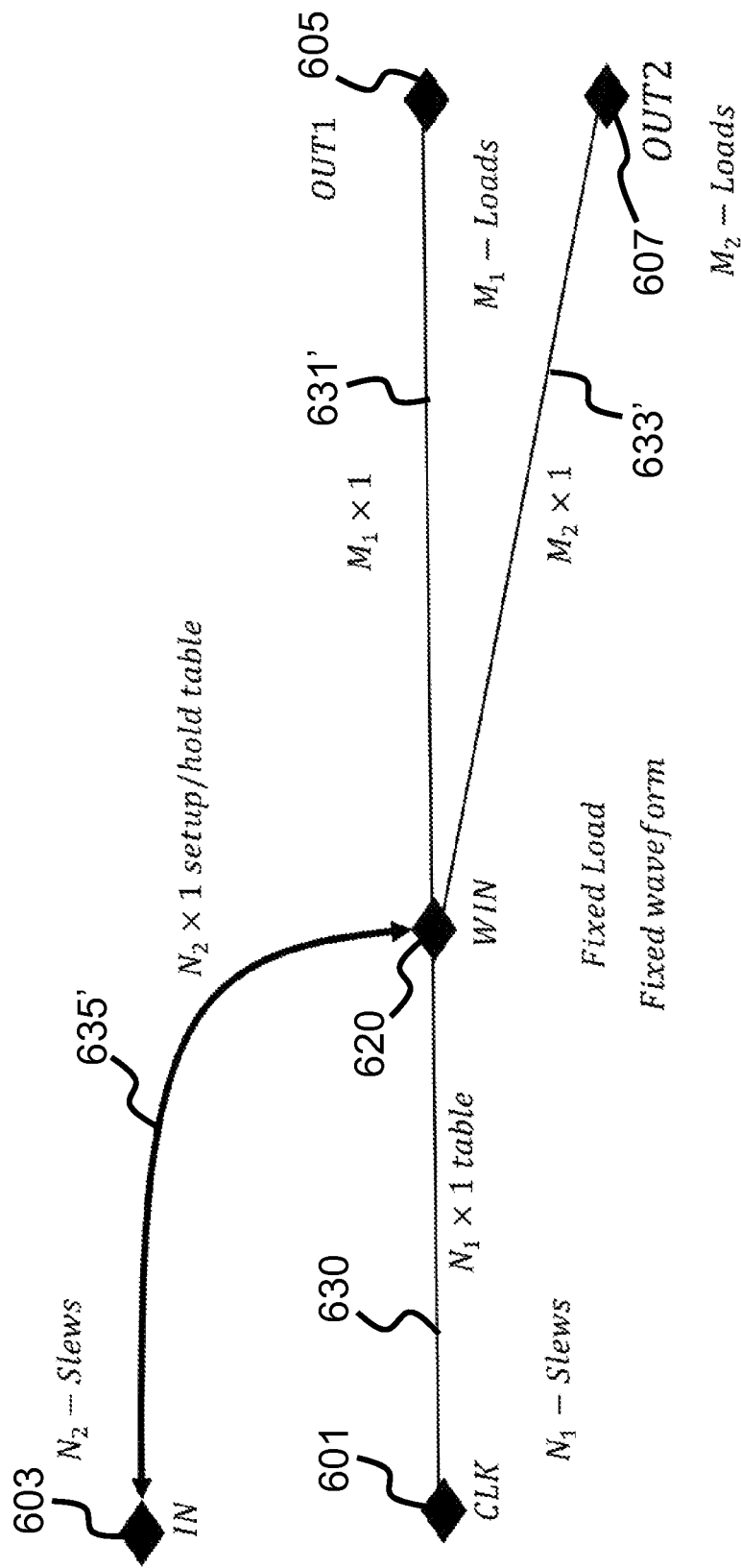
FIG. 6C is a diagram of timing arcs representing the paths of FIG. 6A in accordance with an embodiment of the present invention.

FIG. 6C depicts a compact representation of the circuit block 600 in accordance with an embodiment of the present invention.

Because the portion of the path 610 between the source pin 601 and the WIN 620 is shared between the first and second circuit paths 611 and 613, the timing arc generated from the shared path portion 610 is a first timing arc for both paths.

A shared timing arc 630 is generated to characterize the shared path portion 610 between the source pin 601 and the WIN 620. As previously explained, because this shared timing arc 630 terminates at a WIN with a fixed load, it will only have $N_1$ delay values and only $N_1$ output waveforms.

A first unshared timing arc 631' is generated to characterize only the unshared portion of the first circuit path 611; that is, the portion between the WIN 620 and the first output pin 605. Likewise, a second unshared timing arc 633' is generated to characterize only the unshared portion of the second circuit path 613; that is, the portion between the WIN 620 and the second output pin 607. As previously explained, because each unshared timing arc 631', 633' begins at a WIN with a fixed input slew, the first unshared timing arc 631' will only have $M_1$ delay values and only $M_1$ output waveforms, and the second unshared timing arc 633' will only have $M_2$ delay values and only $M_2$ output waveforms.

As can be seen from FIGS. 6A and 6C, the shared timing arc 630 and the first unshared timing arc 631' together define the timing attributes of the first circuit path 611, and the shared timing arc 630 and the second unshared timing arc 633' together define the timing attributes of the second circuit path 613. That is, the shared timing arc 630 simultaneously represents the "first half" of both circuit paths while requiring the computation runtime and storage space of only one reduced timing arc. Further redundancy is therefore eliminated from the timing model.

Also, those of skill in the art will recognize that the previously described principles of output waveform and delay reduction, by use of a waveform invariant node, may also be applied to setup/hold values of a setup arc. WIN 620 is before flip-flop 609 on the clock path 615, meaning that waveform stabilization has occurred prior to the interaction with the data path 617, and only one input slew parameter of the clock path 615 is applicable to setup/hold computations, rather than $N_1$ input slew parameters. Therefore, instead of defining the interaction of clock path 615 and data path 617 in a setup arc 635 with $N_1 \times N_2$ setup/hold values, a setup arc 635' from the source (constrained) pin 603 to the WIN 620 may be generated that has only $N_2$ setup/hold values, corresponding to the number of predefined setup slew parameters of constrained pin 603. Computations of these $N_2$ setup/hold values will be based on the $N_2$ predefined setup slews, in combination with the uniform waveform at the WIN 620.

Figure 5B:
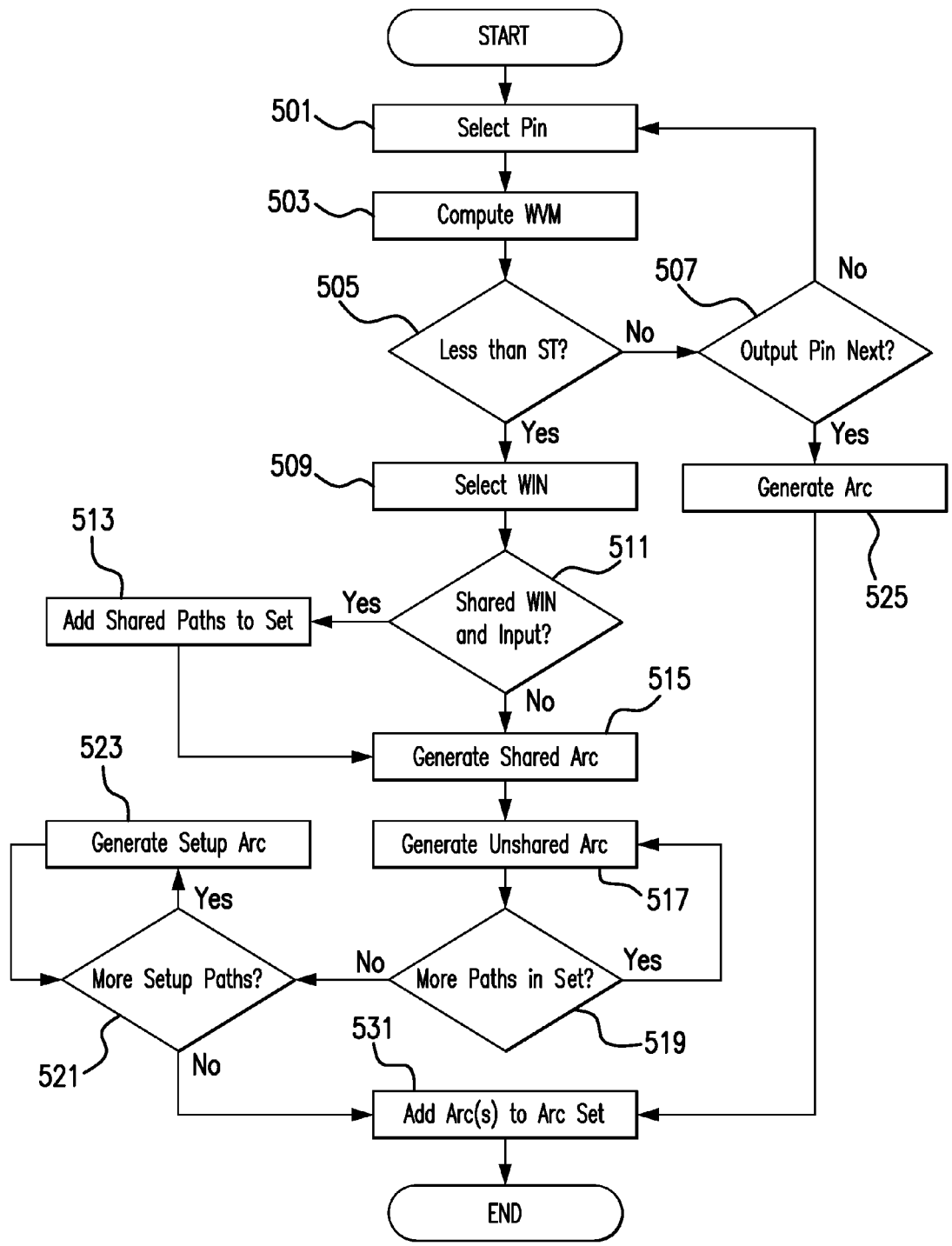
FIG. 5B is a block flowchart illustrating a method of selecting a waveform invariant node and generating timing arcs for a plurality of circuit paths, in accordance with an embodiment of the present invention.

FIG. 5B is a block flowchart illustrating an expanded version of the method of FIG. 5A, in accordance with an embodiment of the present invention, which may consider a plurality of circuit paths. The selection of the WIN in blocks 501 through 509, and the process if no WIN is selected in block 525, occurs as before. At 511, it is determined whether the circuit path shares both the input (source) pin and the pin selected as the WIN with any other of a plurality of circuit paths. All circuit paths matching both criteria are added to a set of shared WIN circuit paths at 513. This set, even if block 513 is bypassed, will also include the original circuit path.

The first (shared) timing arc is then generated from the first path portion of the original circuit path at 515, and the second (unshared) timing arc from the second path portion of the original circuit path at 517, as before. However, it is then checked, at 519, whether there are any uncharacterized circuit paths in the set of shared WIN circuit paths. If so, the flow returns to 517 to characterize the unshared path portion of one of the shared WIN circuit paths. This loop continues until all shared WIN circuit paths have been characterized.

When it is determined at 519 that no remaining shared WIN circuit paths are uncharacterized, it is additionally checked whether any of the shared WIN circuit paths is a clock path interacting with a setup path, at 521. If so, a setup arc representing the interaction is generated at 523 and associated with the corresponding circuit path, and the flow then returns to 521 to check for interactions with additional setup paths. As each setup path considered here is associated with a clock path having a WIN, if the WIN is prior to the flip-flop where the two paths interact, the setup arc is generated at 523 with a one-dimensional setup/hold table as described above.

Once no remaining interacting setup paths are found at 521, all generated arcs are added to an arc set at 531, and the arc set will be used to generate a complete ETM, such as shown in block 245 of FIG. 2, with the appropriate pairs of arcs associated with their corresponding circuit paths. In a subsequent representation of any of the shared WIN circuit paths by the ETM, the ETM will treat the shared and unshared timing arcs of the circuit path as serially oriented, recombining them into the complete circuit path.

It is again noted that the WIN need not be the first stage k for which waveform stabilization occurs within the stabilization tolerance, but may be any stage after k as well. This effect may be accomplished by, for instance, using a stabilization tolerance that is smaller than necessary, for instance less than $1\times10^{-8}$ ns$^2$. So long as a WIN is selected at or after the first possible WIN, and before the output pin, the choice will have no effect on the reduction of output slews and delay values for the paired arcs from N×M to N+M. However, a more exact selection of a WIN still provides the additional advantage of less initial waveform computations, as will be shown in the next section.

5. Reduced Waveform Propagation Simulation

The process of determining a waveform invariant node can be efficiently combined with the characterization of the first path portion. In doing so, the simulation of the waveform propagation during characterization of the path can be substantially reduced in runtime. Specifically, beginning with the waveform invariant node, it is only necessary to simulate the propagation of the uniform waveform once for all predefined input slew parameters.

Figure 7:
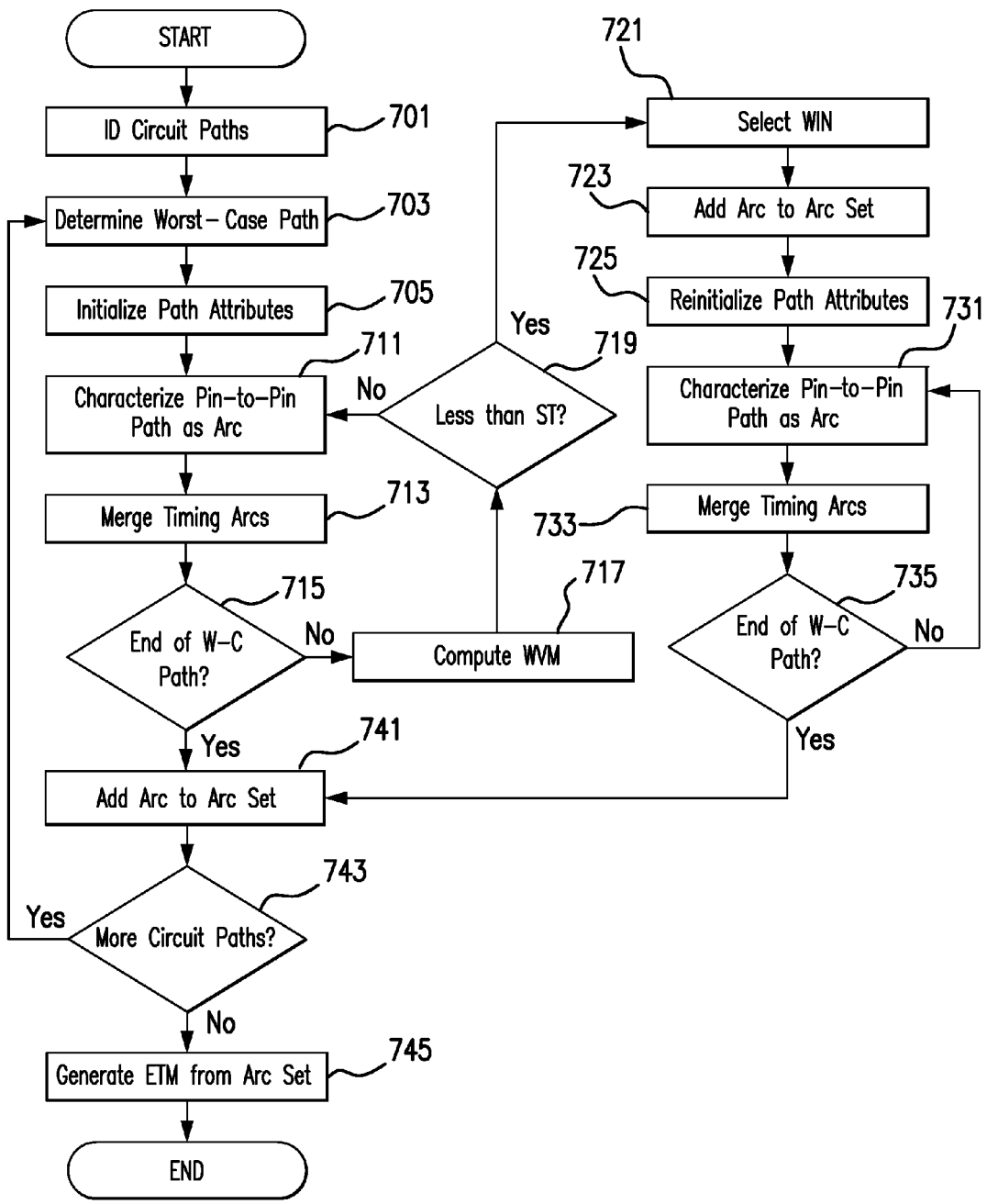
FIG. 7 is a block flowchart illustrating another method of selecting a waveform invariant node and generating timing arcs for a circuit path, in accordance with an embodiment of the present invention.

FIG. 7 is a flowchart illustrating an adaptation of the method of FIG. 2 to include a waveform invariant node selection.

As in FIG. 2, each circuit path is identified at 701, and the worst-case path for a circuit path is determined at 703, with the general timing characteristics determined and initialized at 705. Also as in FIG. 2, the pin-to-pin path is characterized at 711 and merged with an unmerged timing arc at 713, and it is determined whether the end of worst-case path has been reached at 715.

However, it is noted that each pin-to-pin characterization necessarily determines the output waveforms which will be the output slews for the resulting pin-to-pin arc, and these output waveforms will in turn be the input waveforms for the pin-to-pin arc that follows in the next iteration. Therefore, if the end of the worst-case path has not been reached at 715, then at 717, these output waveforms are used to compute the WVM for the output pin of the pin-to-pin arc, which is the input pin of the following pin-to-pin arc.

It is then determined, at 719, whether this WVM is less than the predetermined stabilization tolerance. If not, the flow returns to block 711 and the following pin-to-pin path is characterized as another pin-to-pin arc and merged normally.

If, however, this WVM is less than the predetermined stabilization tolerance, the output pin of the pin-to-pin arc is selected as the waveform invariant node (WIN) at 721. As before, the WIN is both the output pin of the first path portion and the input pin of the second path portion. Therefore, the merged timing arc as it exists represents the entire first path portion, and is immediately converted to an ETM arc and added to the arc set as the first timing arc at 723.

Because the final pin of the first timing arc was not the output pin of the circuit path, as determined at 715, only one load was used for its computations of output slew and delay, and the first timing arc naturally has the characteristic of an equal number of input slew elements, output slew elements, and delay elements.

At 725, the worst-case path characteristics are reinitialized for the second path portion. For instance, the WIN is set as the new source pin, with the source transition also adjusted accordingly, and the uniform waveform for the WIN is set as the lone input waveform (input slew) for the entire second path potion. Other characteristics, such as the sink pin and set of loads from the circuit path which were determined at 703, remain unaltered for the second path portion. Depending on the specific implementation, some or all of these characteristics may have transitioned as part of earlier operations. The merged timing arc is also reinitialized in preparation to form the second timing arc.

A second characterization and merging loop 731, 733, 735 begins with this second path portion, using the single input slew of the second path portion, and operates in the same manner as the first characterization and merging loop 711, 713, 715. Upon normal completion of this loop, the resulting second timing arc will have the characteristic of an equal number of load elements, output slew elements, and delay elements.

Once the end of the second path portion has been reached, the second timing arc is converted to an ETM arc and added to the arc set at 741.

From here, as in FIG. 2, additional circuit paths are checked for at 743, and either the loop repeats, or the ETM is generated from the complete arc set at 745, as appropriate.

Those of skill in the art will be able to combine this method with, for example, part or all of the method of FIG. 5B, to manage shared timing arcs and/or setup arcs. Those of skill in the art will also be able to modify this method to employ processes of path characterization other than that of FIG. 2.

Returning to FIGS. 4A and 4B, for the following equations, n represents a number of sequential relevant pins in the original circuit path 400, "relevant" defined as being the source and/or sink pin of a pin-to-pin timing arc during characterization. By extension, the number of pin-to-pin timing arcs is n−1. WIN 403 is the kth pin of the relevant pins. Furthermore, N represents a number of input slews to be characterized at the input pin 401, and M represents a number of output loads to be characterized at the output pin 403.

Using the original circuit path 400, and a characterization process such as that depicted in FIG. 2, a waveform for each predefined input slew parameter must be computed at each relevant pin beyond the first, as a pin-to-pin timing arc must have a separate output waveform at its output pin computed from each of the input waveforms of the present arc (which are output waveforms of the previous arc). That is, the output pin of each pin-to-pin timing arc must have N output waveforms computed, which are then used to compute the N output waveforms of the following pin-to-pin timing arc.

The final pin-to-pin timing arc is an exception to this rule, as its sink pin is the sink pin of the complete timing arc. As noted previously, the number of output slews for a completed timing arc is dependent not only on the number of input slews, but the number of output loads. When output slews are represented by waveforms, this means that the final pin-to-pin arc, which may also be termed an output arc, requires a different waveform for each combination of input slew and output load—that is, not N waveforms but N×M waveforms. These waveforms will be the output waveforms used to represent the output slews of the entire timing arc.

In other words, the total number of waveforms W which must be computed to characterize the complete circuit path 400 is:

$$W_{400}=\{N\times(n-2)\}+\{N\times M\} \qquad \text{(Eq. 8)}$$

By splitting the circuit path into a first path portion 410 and a second path portion 420, certain aspects of the waveform computations are simplified. To determine the WIN 403 (at the kth pin), all waveforms for the pin-to-pin timing arcs leading up to the WIN 403 must still be computed, so that they may be used in the waveform variant measure computations.

However, because the WIN 403 designates a point at which waveform stabilization is within tolerance, the remaining variation in waveforms may be ignored for the stages of the second path portion 420, and only the uniform waveform need be computed for each stage. That is, N is effectively reduced to 1 for each of these arcs. This includes the final pin-to-pin timing arc, and therefore, the N×M waveforms that must be computed for this arc is effectively reduced to M. Therefore, by finding a WIN 403, the total number of waveforms W which must be computed for the original circuit path 400 is reduced to:

$$W_{410+420} = \{N \times (k-2)\} + \{n-k-1\} + \{M\} \quad \text{(Eq. 9)}$$

This reduction in the number of computed waveforms saves considerably on runtime and memory usage during the generation of the timing arc, and by extension the timing model.

6. ETM Extraction System Applying Waveform Invariant Nodes

Figure 8:
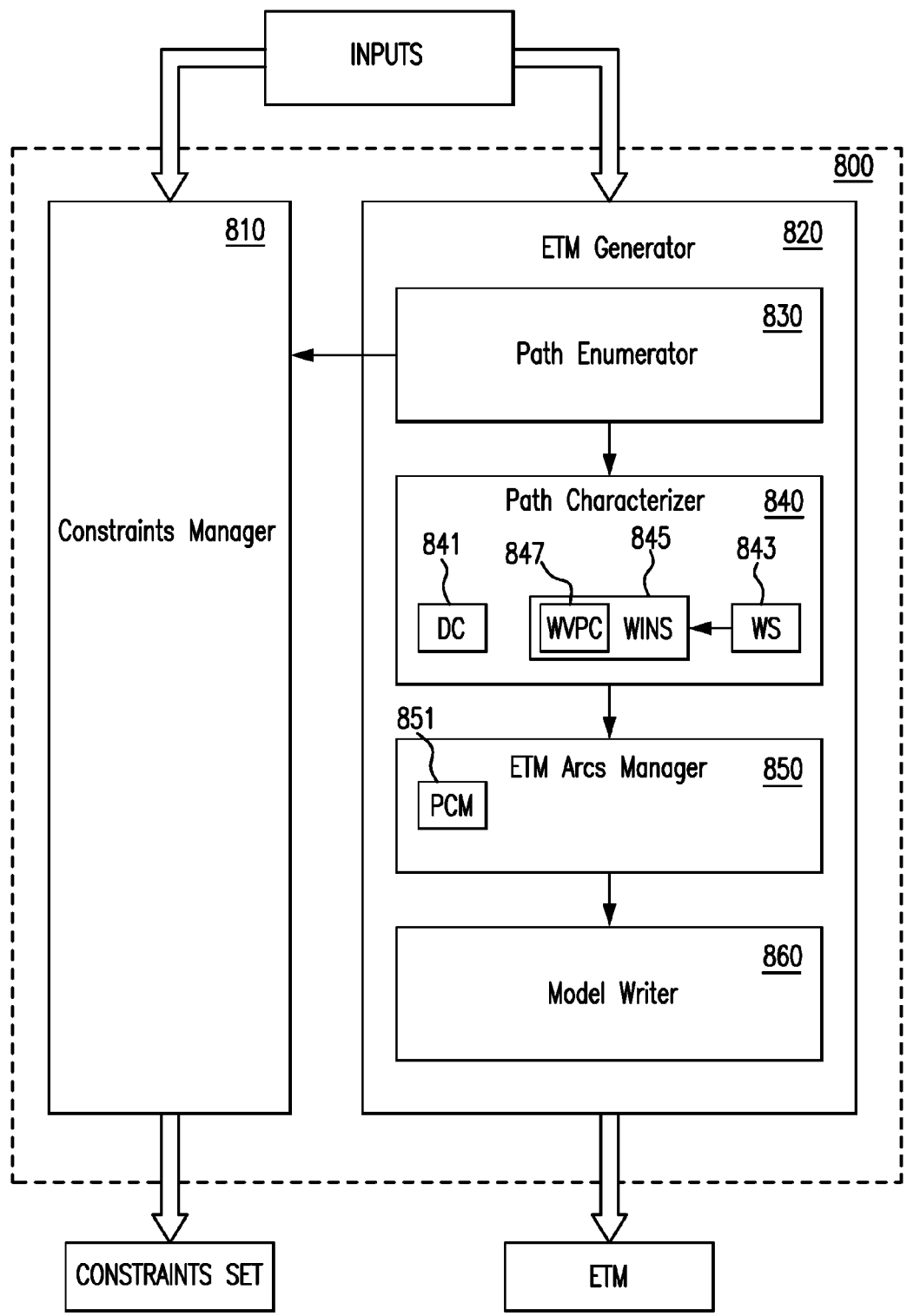
FIG. 8 is a block diagram illustrating a system for selecting a waveform invariant node and generating timing arcs for a circuit path, in accordance with an embodiment of the present invention.

FIG. 8 illustrates an implementation of the functional components of a system for selecting a waveform invariant node and generating timing arcs for a circuit path, and generating a timing model therefrom, in accordance with one exemplary embodiment of the present invention. The system may be implemented using suitable hardware to be described further herein.

Inputs for a given circuit block into a system 800 preferably include one or more of: a netlist of the circuit block, libraries of cells instantiated in the circuit block for different delay-corners, parasitic resistance/capacitance (RC) of the inter-connects for different RC-corners, environment of the design for different constraint-modes, view definitions specifying a list of timing views obtained by the combinations of delay-corners at different operating-conditions (PVT) and analysis modes, and other relevant information/options/settings required for carrying out timing analysis and model extraction of the circuit block.

A path enumerator 830, a path characterizer 840, an ETM arcs manager 850, and a model writer 860 are preferably implemented as components of an ETM generator 820 or other timing model generator. The ETM generator 820 takes the above inputs related to the circuit block, and then executes to extract and output an ETM for the circuit block.

In certain embodiments, a constraints manager 810 is also present and executes to generate assertion sets based on the analysis mode data provided as input, which are preferably outputted in a constraint-definition file. In other embodiments, these assertion sets are generated by the ETM generator 820 and outputted with the ETM.

The path enumerator 830 executes to identify all sequences of timing paths, to enumerate sets of timing paths for various combinations of transitions (rise/fall) and conditions (early/late), and to enumerate the worst-case path for a timing path in a circuit design block. These processes are largely known in the art, and are at least partially expressed, for instance, in blocks 701 and 703 of the method of FIG. 7. In embodiments where a separate constraints manager 810 is present, the path enumerator 830 also preferably passes the constraints of the timing paths to the constraints manager 810.

The path characterizer 840 executes to compute timing attributes of each worst-case path, and for each such path generates a timing arc which contains this information. Processes for these computations are largely known in the art, and are at least partially expressed, for instance, in blocks 705 through 715 of the method of FIG. 7. The path characterizer 840 may also compute the timing attributes of any setup path and clock path interactions, and for each interaction generate a setup arc.

In certain embodiments, computed attributes may also be stored in a cache to be retrieved when it can be determined that another circuit path will share these timing attributes, conserving additional runtime by avoiding the re-computation.

The timing attributes and in particular the delay values are preferably computed more specifically by a delay calculator (DC) 841, which is preferably included in the path characterizer 840, as illustrated in FIG. 8, but may also be a separate component.

When a waveform representation of slews is desired, the input slews and output slews may be computed more specifically by a waveform simulator (WS) 843, which is preferably included in the path characterizer 840, as illustrated in FIG. 8, but may also be a separate component. The waveform simulator simulates the propagation of a waveform from a current pin to a following pin, thus computing an output waveform at the following pin, based on a distinct input waveform at the current pin, an output load at the following pin, and applicable characteristics of the intervening cells and/or connections.

In the proposed system, the path characterizer 840 further includes a waveform invariant node selector (WINS) 845, which takes a set of output waveforms for a pin provided by the waveform simulator 843, computes a waveform invariant parameter such as the waveform invariant measure, and adaptively selects the pin as the waveform invariant node if the parameter is within the predetermined stabilization tolerance. The waveform invariant parameter may be more specifically computed by a waveform variation parameter calculator (WVPC) 847, which is preferably included in the waveform invariant node selector 845. The processes of the waveform invariant node selector 845 are expressed, for instance, in blocks 717 through 721 of the method of FIG. 7, with the processes of the waveform variation parameter calculator 847 more specifically expressed, for instance, in block 717.

In the proposed system, the path characterizer 840 generates both the first and second timing arcs, and determines where the first timing arc ends based on the selection of the WIN by the WINS 845. It also reinitializes certain timing attributes after generating the first timing arc, as expressed, for instance, in block 725 of FIG. 7.

The ETM arcs manager 850 annotates mode identifiers and other information into a timing arc as it is converted to an ETM arc, such that when a particular testing mode is activated during later instantiation of the ETM at the top-level, characteristics of the ETM arc corresponding to that mode are activated. These mode identifiers may be abbreviated or omitted if the arc behaves the same under all possible modes. The ETM arcs manager 850 further adds these ETM arcs into a set for the circuit block. Processes for these functions are largely known in the art, and are at least partially expressed, for instance, in block 741 of the method of FIG. 7. However, it is noted that identifiers such as a waveform invariant node identifier, and/or a first/second arc flag or shared/unshared arc flag, may also be annotated into the arc by the ETM arcs manager 850, to maintain the proper associations between arcs sharing a waveform invariant node. Those of skill in the art will be able to adapt known ETM arcs managers to make these annotations.

A power-ground module (PGM) 851 is preferably included and models associated power rails for an ETM arc. When this module is activated, it models the power and ground rails related to the signal pins and ports modeled in an ETM arc. These rails may be defined in the ETM arc as constructs, in association with the ports (for instance, a clock port may be associated in the ETM with particular defined power and ground pins, the power pin with a defined voltage). The ETM arcs manager 850 then annotates this information into the ETM arc. The power-ground module 851 is preferably included in the ETM arcs manager 850, as illustrated in FIG. 8, but may also be a separate component. The power-ground module 851 may be activated or deactivated through an interface as needed.

The model writer 860 executes to generate ETMs, each ETM based on a set of annotated ETM arcs from the ETM arcs manager 850. The processes for doing so with an ETM arc set are well known in the art, and are at least partially expressed, for instance, in block 745 of the method of FIG. 7. Those of skill in the art will be able to adapt known model writers to maintain the association between a pairing of first and second timing arcs, such that they will be serially oriented to form a representation of their circuit path when the ETM is employed during a simulation. These ETMs are then provided as output.

The above and related processes, and other necessary instructions, may be encoded as executable instructions on one or more non-transitory computer readable media, such as hard disc drives or optical discs, and executed using one or more computer processors, in concert with an operating system or other suitable measures.

In a hardware implementation, the invention may comprise a dedicated processor or processing portions of a system on chip (SOC), portions of a field programmable gate array (FPGA), or other such suitable measures, executing processor instructions for performing the functions described herein or emulating certain structures defined herein. Suitable circuits using, for example, discrete logic gates such as in an Application Specific Integrated Circuit (ASIC), Programmable Logic Array (PLA), or Field Programmable Gate Arrays (FPGA) may also be developed to perform these functions.

Figure 9:
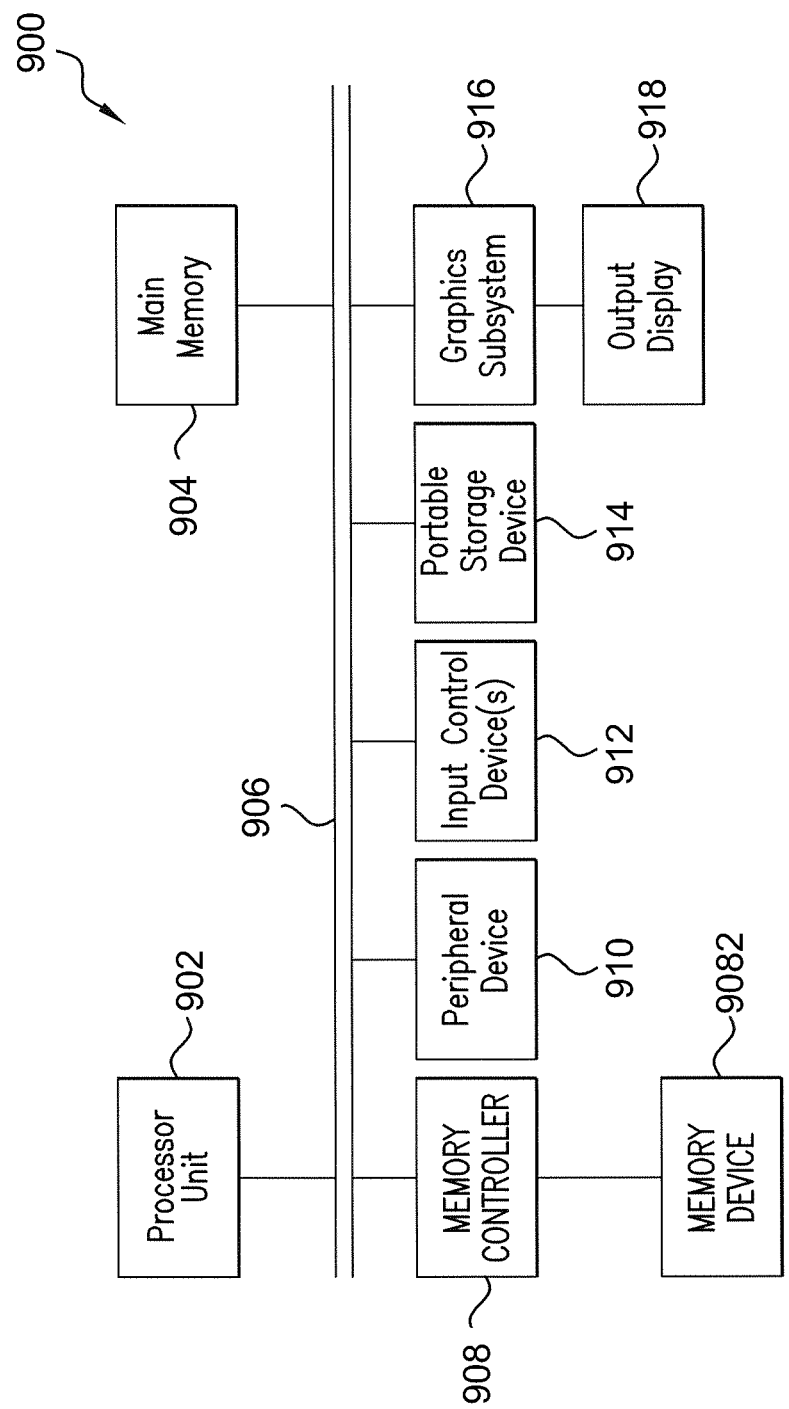
FIG. 9 is a block diagram illustrating an exemplary computer system for programmatic and/or hardware implementation of various embodiments and aspects of the present invention

As an example, FIG. 9 is a block diagram illustrating an exemplary computer system for programmatic and/or hardware implementation of various aspects of the disclosed system and method. For instance, it may serve as a host for such hardware modules, and/or as a host for executing software modules such as EDA tools/simulations/emulation/firmware, in accordance with various configurations of the disclosed system and method.

A computer system 900 contains: a processor unit 902, a main memory 904, an interconnect bus 906, a memory controller 908 that is coupled to a memory device 9082, peripheral device(s) 910, input control device(s) 912, portable storage medium drive(s) 914, a graphics subsystem 916, and an output display 918. Processor unit 902 may include a single microprocessor or a plurality of microprocessors for configuring computer system 900 as a multiprocessor system. Main memory 904 stores, in part, instructions and data to be executed by processor unit 902. Main memory 904 preferably includes banks of dynamic random access memory (DRAM) as well as high-speed cache memory.

For the purpose of simplicity, all the components of computer system 900 are connected via interconnect bus 906. However, computer system 900 may be connected through one or more data transport means. For example, processor unit 902 and main memory 904 may be connected via a local microprocessor bus; and memory controller 908, peripheral device(s) 910, portable storage medium drive(s) 914, and graphics subsystem 916 may be connected via one or more input/output (I/O) buses. Memory device 9082 may be implemented as a nonvolatile semiconductor memory for storing data and instructions to be used by processor unit 902. Memory device 9082 may store the software to load it to the main memory 904 or may be represented in an EDA tool simulation by suitable classes (incorporating data structures and functions operable upon the data structures) or the like as would be known to one of skill in the art.

Portable storage medium drive 914 operates to input and output data and code to and from the computer system 900. In one configuration, the software is stored on such a portable medium, and is input to computer system 900 via portable storage medium drive 914. Peripheral device(s) 910 may include any type of computer support device such as an input/output (I/O) interface, to add additional functionality to computer system 900. For example, peripheral device(s) 910 may include a network interface card, to interface computer system 900 to a network. Peripheral device(s) may also include a memory controller and nonvolatile memory.

Input control device(s) 912 provide a portion of the user interface for a computer system 900 user. Input control device(s) 912 may include an alphanumeric keypad for inputting alphanumeric and other key information; and a cursor control device such as a mouse, a trackpad or stylus; or cursor direction keys.

In order to display textual and graphical information, computer system 900 contains graphics subsystem 914 and output display(s) 918. Output display 918 may include a cathode ray tube (CRT) display, liquid crystal display (LCD), plasma, or active matrix organic light emitting diode (AMOLED) display. Graphics subsystem 716 receives textual and graphical information, and processes the information for output to display 918.

7. Results of the Disclosed Systems and Methods

Using the disclosed systems and methods, a considerable reduction of the number of necessary waveform computations for a timing model is made possible without reduction in accuracy, saving runtime and memory in the generation of the model, as well as data storage space necessary for the model itself.

Table 1, below, shows a comparison of runtime and memory usage in generating a timing model (specifically, an extracted timing model, or ETM) under conventional methods and under the disclosed methods described herein.

TABLE 1

| | Traditional Flow | | Disclosed Flow | | | |
| --- | --- | --- | --- | --- | --- | --- |
| # | Runtime (s) R1 | Memory (MB) M1 | Runtime (s) R2 | Memory (MB) M2 | R1/R2 | M1/M2 |
| 1 | 19 | 39 | 11 | 29 | 1.7 | 1.3 |
| 2 | 43 | 98 | 18 | 32 | 2.4 | 3.1 |
| 3 | 322 | 609 | 166 | 203 | 1.9 | 3.0 |
| 4 | 453 | 875 | 218 | 395 | 2.1 | 2.2 |
| 5 | 568 | 1323 | 529 | 1249 | 1.1 | 1.1 |
| 6 | 1014 | 2452 | 431 | 1047 | 2.4 | 2.3 |

As can be seen, over six circuit designs of varying complexities, the disclosed methods of ETM extraction, when slews are modeled as waveforms, consistently outperformed the conventional methods, frequently by a factor of two or better. It may be noted that less improvement is present in the cases where the waveform computation is not the bottleneck for the extraction and/or where most of the paths are too short for waveform stabilization to occur, as in the fifth design.

Table 2, below, shows a comparison of ETM sizes generated under various methodologies. S1 represents the size of a slew rate-based ETM, that is, without waveform representation. S2 represents the size of a waveform-based ETM generated using conventional processes, and S3 represents the size of a waveform-based ETM generated using the disclosed processes.

TABLE 2

| # | Size of Slew Rate ETM (KB) S1 | Size of Waveform ETM (KB) S2 | Size of Waveform ETM as Disclosed (KB) S3 | Size Increase w/Waveforms S2/S1 | Size Increase w/Disclosed Processes S3/S1 | S3/S2 |
|---|---|---|---|---|---|---|
| 1 | 1226 | 13210 | 2114 | 10.8 | 1.7 | 6.2 |
| 2 | 826 | 15722 | 3258 | 19.0 | 3.9 | 4.8 |
| 3 | 22922 | 487850 | 74530 | 21.3 | 3.3 | 6.5 |
| 4 | 14402 | 335514 | 52754 | 23.3 | 3.7 | 6.4 |
| 5 | 1688 | 6288 | 1900 | 3.8 | 1.1 | 3.3 |
| 6 | 18882 | 626834 | 69074 | 33.2 | 3.7 | 9.1 |

S2/S1 represents the increase in size of an ETM when waveform representation is conventionally added. It may be noted that this regularly results in the size increasing by a factor of 20. In comparison, S3/S1 represents the increase in size of an ETM when waveform representation is added under the disclosed processes. Here, the addition of waveform representation increases the size of the ETM by less than a factor of 4. S3/S2 further shows the reduction in size between the conventional waveform representation and the compact representation; the disclosed methodology may be expected to result, on average, in an ETM six times smaller than for the conventional methodology.

It may be noted that the ETM stores not only the timing arcs, but also encapsulates other information such as the name/direction of interface ports, design rules such as maximum allowed transition/load at the pins, self-loading of the output ports and other attributes that are essential for carrying out the top-level timing analysis. This information consumes a significant portion of the ETM size and is identical in a conventional waveform-based ETM and in the proposed waveform-based ETM.

Therefore, the reduction in size specifically of the representations of timing arcs is greater than what is shown in Table 2. It should also be noted that for short paths, such as minimum delay paths or hold-check paths, the path may be too short for waveform stabilization to occur and a WIN may not exist. In such cases, the compact representation of arcs in the ETM is not possible using the proposed methodology.

Table 3, below, shows a comparison of the size of ETMs generated under the conventional and disclosed methods with only slew rate representation of slews even for the disclosed methods.

TABLE 3

| # | Size of Conventional ETM without Waveform (KB) S1 | Size of Disclosed ETM without Waveform (KB) S2 | Number of WINs | S1/S2 |
|---|---|---|---|---|
| 1 | 1226 | 778 | 23 | 1.6 |
| 2 | 826 | 530 | 1 | 1.6 |
| 3 | 22922 | 16162 | 255 | 1.4 |
| 4 | 14402 | 5562 | 230 | 2.6 |
| 5 | 1688 | 972 | 23 | 1.7 |
| 6 | 18882 | 6290 | 116 | 3.0 |

It is seen here that, even in this case, a size reduction of roughly 1.5 or better is consistently present, due to removal of redundant slews and delays. Therefore, the disclosed system and method have applications even without the modeling of waveforms in the timing model.

The descriptions above are intended to illustrate possible implementations of the disclosed system and method, and are not restrictive. While this disclosure has been made in connection with specific forms and embodiments thereof, it will be appreciated that various modifications other than those discussed above may be resorted to without departing from the spirit or scope of the disclosed system and method. Such variations, modifications, and alternatives will become apparent to the skilled artisan upon a review of the disclosure. For example, functionally equivalent elements or method steps may be substituted for those specifically shown and described, and certain features may be used independently of other features, and all or some of the above embodiments may be selectively combined with each other, and in certain cases, particular locations of elements or sequence of method steps may be reversed or interposed, all without departing from the spirit or scope of the disclosed system and method as defined in the appended claims. The scope should therefore be determined with reference to the description above and the appended claims, along with their full range of equivalents.

What is claimed is:

1. A method of compressing a timing model representing at least one circuit path of an electronic circuit, the circuit path traversing at least one circuit stage coupled to a plurality of pins, the method comprising:

predefining a plurality of alternate input parameter values for a predetermined input parameter and a plurality of alternate output parameter values for a predetermined output parameter for the circuit path, each of the predefined alternate input parameter values having associated therewith an input signal waveform representing voltage change over time; and executing a processor to generate a timing model for instantiating each combination of predefined alternate input and output parameter values, the timing model defining a timing arc between each selected combination of predefined alternate input and output parameter values, the timing arc being decomposed into at least first and second timing arc components;

the generation of the timing model including:

selectively identifying one of the pins as a waveform invariant node for propagation of the input signal waveforms through the circuit path, the input signal waveforms as propagated reducing in mutual waveform variation with respect to one another during propagation from an input pin of the circuit path to the waveform invariant node, the input signal waveforms as propagated substantially converging thereby to a uniform waveform beyond the waveform invariant node, and generating the first timing arc component to parametrically define timing attributes of a first path portion extending from the input pin to the waveform invariant node, and generating the second timing arc component to parametrically define timing attributes of a second path portion extending from the waveform invariant node to an output pin of the circuit path;

wherein the first timing arc component defines, for each of the predefined alternate input parameter values, a first arc output waveform based on the corresponding predefined alternate input parameter value and subject to a common value of the predetermined output parameter at the waveform invariant node, and wherein the second timing arc component defines, for each of the predefined alternate output parameter values, a second arc output waveform based commonly on the uniform waveform and subject to the corresponding predefined alternate output parameter value;

wherein the electronic circuit is adaptively updated responsive to testing based on the timing model.

2. The method of claim 1, wherein the waveform invariant node is selectively identified by:
computing a waveform variation parameter for at least one of the pins in the circuit path, the waveform variation parameter indicating a degree of mutual difference between input signal waveforms as propagated through the pin, and
if the waveform variation parameter at the pin is within a predetermined stabilization tolerance, identifying the pin as the waveform invariant node.

3. The method of claim 2, wherein the waveform variation parameter at a pin is computed as $$\frac{1}{N-1}\sum_{i=1}^{N-1} WVM(W_1, W_{i+1})$$

where N represents a number of waveforms propagated through the pin, $W_i$ represents an ith waveform as propagated through the pin, and $WVM(W_a, W_b)$ represents a mean square difference of two waveforms $W_a, W_b$.

4. The method of claim 3, wherein each waveform includes a plurality of samples, each sample including a time value and a voltage value, and wherein $WVM(W_a, W_b)$ is computed as $$\frac{1}{|W_a|}\sum_{i=1}^{|W_a|} \{time(W_a, voltage(W_a, i)) - time(W_b, voltage(W_a, i))\}^2$$

where voltage(W, i) represents a voltage of an ith sample in a waveform W, time(W,V) represents an interpolated time on the waveform W having a voltage V, and |W| represents a number of samples in the waveform W.

5. The method of claim 2, wherein the predetermined stabilization tolerance is $1\times10^{-8}$ $ns^2$ or less.

6. The method of claim 2, wherein the circuit path traverses a plurality of circuit stages, and the waveform variation parameter is computed at an input pin of each of at least a consecutive subset of the plurality of circuit stages in an order of waveform propagation through the circuit stages.

7. The method of claim 1,
wherein the circuit path is a clock path having a corresponding setup path, the setup path traversing at least one circuit stage coupled to a plurality of pins, and
wherein the method further comprises predefining a plurality of alternate setup input parameter values for a predetermined setup input parameter, and
wherein the generation of the timing model further includes generating a setup arc for the interaction of the clock path and setup path to parametrically define a setup/hold value for each of the predefined alternate setup input parameter values, each setup/hold value based on the corresponding predefined alternate setup input parameter value and on the uniform waveform.

8. The method of claim 1,
wherein the timing model further represents at least a shared source circuit path, the circuit path and the shared source circuit path sharing an input pin,
wherein the generation of the timing model further includes determining whether the waveform invariant node matches a pin of the shared source circuit path,
wherein, if the waveform invariant node of the circuit path matches a pin of the shared source circuit path, the waveform invariant node of the circuit path is selected as the waveform invariant node of the shared source circuit path, and the first timing arc component of the circuit path is selected as the first timing arc component of the shared source circuit path, and
wherein, if the waveform invariant node of the circuit path does not match a pin of the shared source circuit path, the first timing arc component of the shared source circuit path is generated based on a waveform invariant node separately selected for the shared source circuit path.

9. The method of claim 1,
wherein the timing model is an extracted timing model,
wherein the predetermined input parameter is an input slew parameter,
wherein the predetermined output parameter is an output load parameter,
wherein each first arc output waveform represents a change in voltage over time at the waveform invariant node, and
wherein each second arc output waveform represents a change in voltage over time at the output pin of the circuit path.

10. A method of streamlined generation of a waveform-based timing model representing at least one circuit path of an electronic circuit, the circuit path traversing at least one circuit stage coupled to a plurality of pins, the method comprising:
predefining a plurality of alternate input parameter values for a predetermined input parameter and a plurality of alternate output parameter values for a predetermined output parameter for the circuit path, each of the predefined alternate input parameter values having associated therewith an input signal waveform representing voltage change over time; and
executing a processor to generate a timing model for instantiating each combination of predefined alternate input and output parameter values, the timing model defining a timing arc between each selected combination of predefined alternate input and output parameter values,
wherein the generation of the timing model includes:
simulating propagation of each of the input signal waveforms through consecutive ones of the pins in a first path portion of the circuit path, and thereafter substituting further propagation of the input signal waveforms with simulated propagation of one uniform waveform through consecutive ones of the pins in a second path portion of the circuit path,
computing a waveform variation parameter for at least one of the pins in the first path portion, the waveform variation parameter indicating a degree of mutual difference between input signal waveforms as propagated through the pin; and
selectively identifying one of the pins as a waveform invariant node responsive to the waveform variation parameter at the pin, and
wherein the first path portion is defined between a first of the pins of the circuit path and the waveform invariant node, and the second path portion is defined between the waveform invariant node and a last of the pins of the circuit path;

wherein the electronic circuit is adaptively updated responsive to testing based on the timing model.

11. The method of claim 10, wherein the waveform invariant node is selectively identified as a pin for which the waveform variation parameter is within a predetermined stabilization tolerance.

12. The method of claim 10, wherein the uniform waveform is selected from one of the input signal waveforms as propagated through the waveform invariant node.

13. The method of claim 10, wherein the generation of the timing model further includes generating a first timing arc component parametrically defining timing attributes of the first path portion, and generating a second timing arc component parametrically defining timing attributes of the second path portion, the timing arc of the timing model defined at least in part by a combination of the first and second timing arc components.

14. The method of claim 10, wherein a waveform variation parameter is computed for an output pin of each of a plurality of circuit stages in the first path portion.

15. The method of claim 10,
wherein the timing model is an extracted timing model,
wherein the predetermined input parameter is an input slew parameter, and
wherein the predetermined output parameter is an output load parameter.

16. A system for streamlined generation of a waveform-based timing model representing at least one circuit path of an electronic circuit, the circuit path traversing at least one circuit stage coupled to a plurality of pins, the system comprising a timing model generator configured, for a plurality of predefined alternate input parameter values for a predetermined input parameter and a plurality of predefined alternate output parameter values for a predetermined output parameter, each of the predefined alternate input parameter values having associated therewith an input signal waveform representing voltage change over time, to generate a timing model for instantiating each combination of predefined alternate input and output parameter values, the timing model defining a timing arc between each selected combination of predefined alternate input and output parameter values, the timing model generator including:
  a waveform simulator configured to simulate propagation of a waveform through a plurality of pins,
  a waveform variation parameter calculator configured to compute a waveform variation parameter indicating a degree of mutual difference between waveforms, and
  a waveform invariant node selector configured to selectively identify a pin as a waveform invariant node responsive to the waveform variation parameter at the pin,
wherein the generation of the timing model includes:
  in the waveform simulator, simulating propagation of each of the input signal waveforms through consecutive ones of the pins in a first path portion of the circuit path, and thereafter substituting further propagation of the input signal waveforms with simulated propagation of one uniform waveform through consecutive ones of the pins in a second path portion of the circuit path,
  in the waveform variation parameter calculator, for at least one of the pins in the first path portion, computing the waveform variation parameter between input signal waveforms as propagated through the pin, and
  in the waveform invariant node selector, selectively identifying one of the pins as a waveform invariant node responsive to the waveform variation parameter at the pin, and
wherein the first path portion is defined between a first of the pins of the circuit path and the waveform invariant node, and the second path portion is defined between the waveform invariant node and a last of the pins of the circuit path;
wherein the electronic circuit is adaptively updated responsive to testing based on the timing model.

17. The system of claim 16, wherein the waveform invariant node selector selectively identifies the waveform invariant node as a pin for which the waveform variation parameter is within a predetermined stabilization tolerance.

18. The method of claim 16, wherein the timing model generator selects the uniform waveform from one of the input signal waveforms as propagated through the waveform invariant node.

19. The method of claim 16,
wherein the timing model is an extracted timing model,
wherein the predetermined input parameter is an input slew parameter,
wherein the predetermined output parameter is an output load parameter,
wherein the timing model generator further includes a path characterizer configured to generate timing arc components, and
wherein the generation of the timing model further includes generating a first timing arc component parametrically defining timing attributes of the first path portion, and a second timing arc component parametrically defining timing attributes of the second path portion, the timing arc of the timing model defined at least in part by a combination of the first and second timing arc components.

20. The method of claim 16, wherein the computation of the waveform variation parameter in the generation of the timing model is performed for an output pin of each of a plurality of circuit stages in the first path portion.

* * * * *